(12) United States Patent
Kawakami et al.

(10) Patent No.: US 7,646,010 B2
(45) Date of Patent: Jan. 12, 2010

(54) LIGHT-EMITTING ELEMENT, LIGHT-EMITTING DEVICE, AND ELECTRONIC DEVICE

(75) Inventors: Sachiko Kawakami, Isehara (JP); Kumi Kojima, Machida (JP); Satoshi Seo, Kawasaki (JP); Ryoji Nomura, Yamato (JP); Daisuke Kumaki, Tokamachi (JP); Hisao Ikeda, Atsugi (JP); Junichiro Sakata, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 398 days.

(21) Appl. No.: 10/579,804

(22) PCT Filed: Nov. 22, 2005

(86) PCT No.: PCT/JP2005/021933

§ 371 (c)(1),
(2), (4) Date: May 18, 2006

(87) PCT Pub. No.: WO2006/057420

PCT Pub. Date: Jun. 1, 2006

(65) Prior Publication Data

US 2007/0152572 A1    Jul. 5, 2007

(30) Foreign Application Priority Data

Nov. 26, 2004    (JP)    ............... 2004-342717

(51) Int. Cl.
*H01L 35/24* (2006.01)
*H01L 51/00* (2006.01)

(52) U.S. Cl. .................. 257/40; 257/E51.001
(58) Field of Classification Search ........ 257/40
See application file for complete search history.

(56) References Cited

U.S. PATENT DOCUMENTS 5,972,247 A    10/1999    Shi et al.

(Continued)

FOREIGN PATENT DOCUMENTS

EP    1 029 909    8/2000

(Continued)

OTHER PUBLICATIONS

Danel et al, Chemical Materials, (2002), vol. 14, p. 3860-3865.*

(Continued)

*Primary Examiner*—Kenneth A Parker
*Assistant Examiner*—Anthony Ho
(74) *Attorney, Agent, or Firm*—Eric J. Robinson; Robinson Intellectual Property Law Office, P.C.

(57) ABSTRACT

It is an object of the present invention to provide a light-emitting element capable of reducing malfunction due to oxidation and crystallization of a compound. According to one aspect of the present invention, a light-emitting element has a first electrode and a second electrode, a first layer and a second layer formed between the first electrode and the second electrode, wherein the first layer contains an anthracene derivative and a substance that shows electron acceptability to the anthracene derivative, wherein the second layer contains a light emitting substance. According to one aspect of a light-emitting device of the present invention, any one of the above light-emitting elements is used as a pixel or a light source.

9 Claims, 20 Drawing Sheets

U.S. PATENT DOCUMENTS

| | | | |
|---|---|---|---|
| 6,013,384 A | 1/2000 | Kido et al. | |
| 6,541,129 B1* | 4/2003 | Kawamura et al. | 428/690 |
| 6,743,948 B1 | 6/2004 | Hosokawa et al. | |
| 6,929,871 B2 | 8/2005 | Arakane et al. | |
| 2001/0025956 A1* | 10/2001 | Bohler et al. | 257/40 |
| 2002/0034656 A1* | 3/2002 | Thompson et al. | 428/690 |
| 2002/0037429 A1 | 3/2002 | Sato et al. | |
| 2002/0050786 A1* | 5/2002 | Yamazaki et al. | 313/504 |
| 2003/0062520 A1* | 4/2003 | Toguchi et al. | 257/40 |
| 2003/0072966 A1 | 4/2003 | Hosokawa et al. | |
| 2003/0143430 A1* | 7/2003 | Kawamura et al. | 428/690 |
| 2003/0189401 A1 | 10/2003 | Kido et al. | |
| 2004/0018380 A1 | 1/2004 | Aziz et al. | |
| 2005/0038296 A1 | 2/2005 | Hosokawa et al. | |
| 2005/0260450 A1 | 11/2005 | Yamagata et al. | |
| 2006/0043858 A1 | 3/2006 | Ikeda et al. | |

FOREIGN PATENT DOCUMENTS

| | | |
|---|---|---|
| JP | 10-270172 | 10/1998 |
| JP | 09-063771 | 3/1999 |
| JP | 11-307264 | 11/1999 |
| JP | 2000-309566 | 11/2000 |
| JP | 2003-272860 | 9/2003 |
| WO | WO 00/14174 | 3/2000 |
| WO | WO 2005/031798 | 4/2005 |
| WO | WO 2006/009262 | 1/2006 |

OTHER PUBLICATIONS

International Search Report (Application No. PCT/JP2005/021933) dated Jan. 10, 2006.

Written Opinion (Application No. PCT/JP2004/021933) dated Jan. 10, 2006.

Danel.K et al., "Blue-Emitting Anthracenes With End-Capping Diarylamines", Chemical Materials, 2002, vol. 14, No. 9, pp. 3860-3865.

Written Opinion (Application No. PCT/JP2005/021933) dated Jan. 10, 2006.

* cited by examiner

LIGHT-EMITTING ELEMENT, LIGHT-EMITTING DEVICE, AND ELECTRONIC DEVICE

TECHNICAL FIELD

The present invention relates to a light-emitting element having a layer containing a light-emitting substance between a pair of electrodes, in particular, a light-emitting element that emits light by current excitation, and relates to a light-emitting device and an electronic device using the light-emitting element.

BACKGROUND ART

A light-emitting element having a layer containing a light-emitting substance between a pair of electrodes, which is used as a pixel, a light source, or the like, is provided for a light-emitting device such as a display device or a lighting system. In such a light-emitting device, reliability of a light-emitting element is related closely with performance of a light-emitting device. For example, when a short circuit is generated between the pair of electrodes of a light-emitting element, a display image is distorted or light with adequate intensity cannot be lighted.

Therefore, development of a light-emitting element capable of emitting light with long-term stability and with few defective elements has recently been promoted. For example, Reference 1: Japanese Patent Application Laid Open No. H9-63771 discloses a manufacturing technique of a light-emitting element that operates with a low driving voltage by using metal oxide having a high work function such as molybdenum oxide. In addition, life-extension effect is also obtained.

However, molybdenum oxide is crystallized easily and the technique described in Reference 1 cannot adequately reduce malfunction of a light-emitting element due to crystallization. In addition, malfunction is also caused due to the generation of a short circuit as well as a life expectancy of a light-emitting element; therefore, counter measures against these causes are necessary.

DISCLOSURE OF INVENTION

It is an object of the present invention to provide a light-emitting element capable of reducing malfunction due to oxidation and crystallization of a compound in a layer containing a light-emitting substance.

An anthracene derivative used for implementing the present invention is represented by the following general formula (1) or (2).

(1)

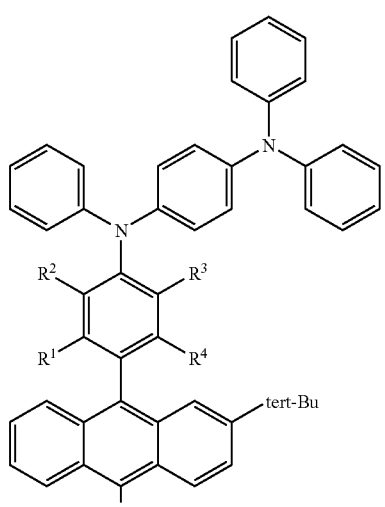

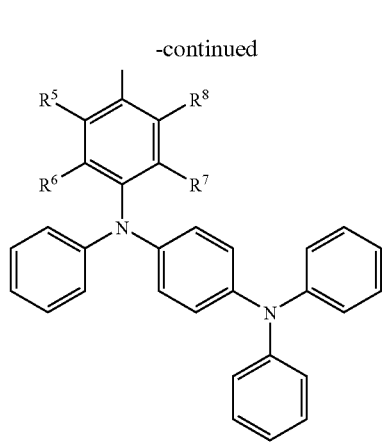

In the general formula (1), $R^1$ to $R^8$ are individually any one of hydrogen and an alkyl group having 1 to 4 carbon atoms, or $R^1$ and $R^2$, $R^3$ and $R^4$, $R^5$ and $R^6$, and $R^7$ and $R^8$ are individually bonded to from an aromatic ring. The bond of $R^1$ and $R^2$, the bond of $R^3$ and $R^4$, the bond of $R^5$ and $R^6$, and the bond of $R^7$ and $R^8$ are independent of one another.

(2)

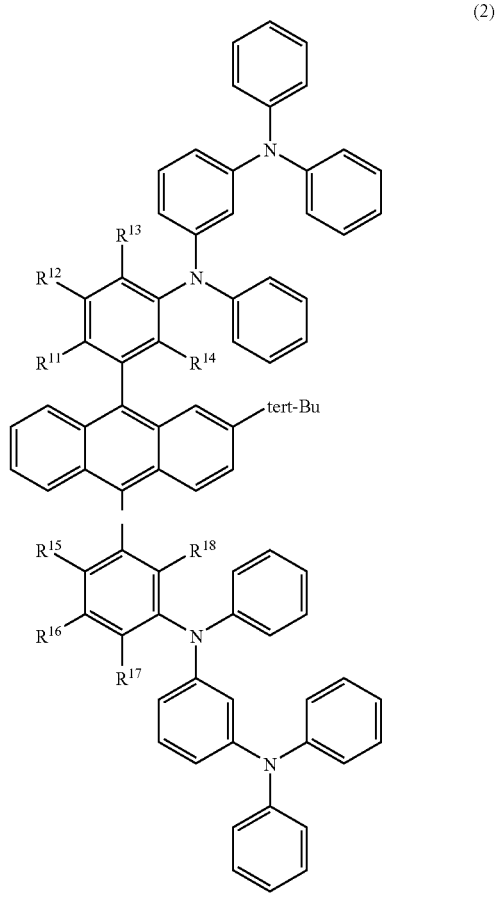

In the general formula (2), $R^{11}$ to $R^{18}$ are individually any one of hydrogen and an alkyl group having 1 to 4 carbon atoms, or $R^{11}$ and $R^{12}$, $R^{12}$ and $R^{13}$, $R^{15}$ and $R^{16}$, and $R^{16}$ and $R^{17}$ are individually bonded to from an aromatic ring. The bond of $R^{11}$ and $R^{12}$, the bond of $R^{12}$ and $R^{13}$, the bond of $R^{15}$ and $R^{16}$, and the bond of $R^{16}$ and $R^{17}$ are independent of one another.

According to one aspect of the present invention, a light-emitting element has a layer for generating holes between a first electrode and a second electrode. The layer for generating holes contains an anthracene derivative represented by the general formula (1) or (2) and metal oxide.

According to another aspect of the present invention, a light-emitting element has a layer for generating holes and a layer containing a light-emitting substance between a first electrode and a second electrode. Here, the layer for generating holes contains an anthracene derivative represented by the general formula (1) or (2) and metal oxide. The metal oxide shows electron acceptability to the anthracene derivative represented by the general formula (1) or (2). The layer containing a light-emitting substance may be either a single layer or a multilayer. In addition, in the case of a multilayer, it is only necessary that at least one layer contains a light-emitting substance.

According to another aspect of the present invention, a light-emitting element has a layer for generating holes, a layer containing a light-emitting substance, and a layer for generating electrons between a first electrode and a second electrode. The layer for generating holes is provided between the layer containing a light-emitting substance and the first electrode. In addition, the layer for generating electrons is provided between the layer containing a light-emitting substance and the second electrode. Here, the layer for generating holes contains an anthracene derivative represented by the general formula (1) or (2) and metal oxide. The metal oxide shows electron acceptability to the anthracene derivative represented by the general formula (1) or (2). The layer containing a light-emitting substance may be either a single layer or a multilayer. Further, in the case of a multilayer, it is only necessary that at least one layer contains a light-emitting substance.

According to the other aspect of the present invention, a light-emitting element has a first layer, a second layer, and a third layer between a first electrode and a second electrode. The first layer is a layer for generating holes, and the second layer is a layer for generating electrons. In addition, the third layer is a layer containing a light-emitting substance. The first layer is provided nearer the first electrode side than the second layer, and the third layer is provided nearer the second electrode side than the second layer. The first layer contains an anthracene derivative represented by the general formula (1) or (2) and metal oxide. The metal oxide shows electron acceptability to the anthracene derivative represented by the general formula (1) or (2). Moreover, when a voltage is applied so that the potential of the first electrode gets lower than that of the second electrode, junction of the second layer and the third layer are made so that electrons are injected from the second layer to the third layer; thus, light is emitted. The layer containing a light-emitting substance may be either a single layer or a multilayer. Further, in the case of a multilayer, it is only necessary that at least one layer contains a light-emitting substance.

According to one aspect of a light-emitting device of the present invention, any one of the above light-emitting elements is used as a pixel or a light source.

According to one aspect of an electronic device of the present invention, a light-emitting device using any one of the above light-emitting elements as a pixel is used for a display portion.

According to the other aspect of an electronic device of the present invention, a light-emitting device using any one of the above light-emitting elements as a light source is used for a lighting portion.

Since an anthracene derivative used for implementing the present invention has resistance to the repetition of oxidation reaction, a light-emitting element with little malfunction due to oxidation reaction can be obtained by implementing the present invention. In addition, an anthracene derivative and metal oxide obstruct crystallization with each other by mixing an anthracene derivative and metal oxide used for implementing the present invention; therefore, a light-emitting element with little malfunction due to crystallization of a hole-generating layer can be obtained by implementing the present invention.

A light-emitting element used for implementing the present invention has little malfunction due to oxidation reaction and crystallization) therefore, a light-emitting device with few display defects or the like due to a defect of a light-emitting element can be obtained by implementing the present invention.

Since a light-emitting device used for implementing the present invention uses a light-emitting element with little malfunction due to oxidation reaction and crystallization, there are few display defects or the like due to malfunction of a light-emitting element. Therefore, there is little image misidentification due to a display defect in a light-emitting device by implementing the present invention; thus, an electronic device capable of transmitting accurate information to a user through a display image can be obtained.

BEST MODE FOR CARRYING OUT THE INVENTION

The embodiment modes according to the present invention will hereinafter be described referring to the accompanying drawings. It is easily understood by those who skilled in the art that the embodiment modes and details herein disclosed can be modified in various ways without departing from the purpose and the scope of the present invention. The present invention should not be interpreted as being limited to the description of the embodiment modes to be given below.

Embodiment Mode 1

An example of a light-emitting element of the present invention will be explained with reference to FIG. 1.

Figure 1:
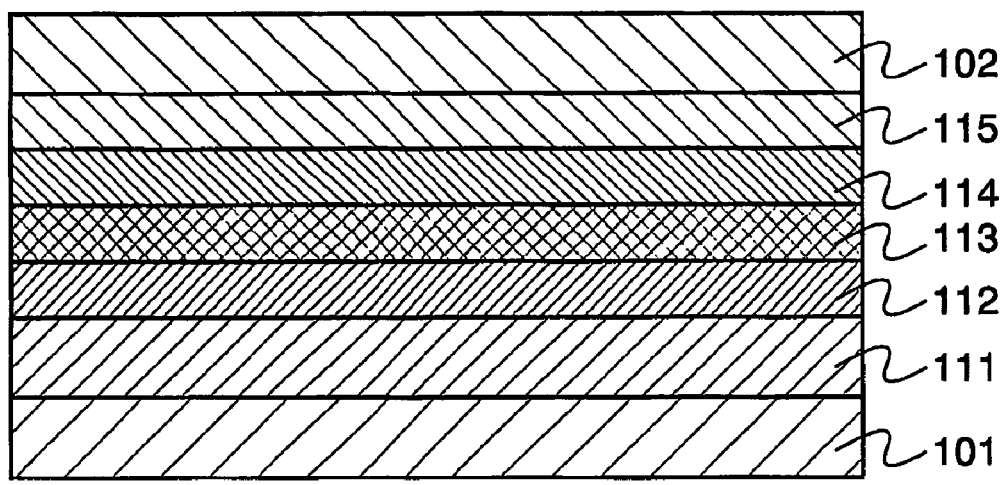
FIG. 1 is a diagram explaining one example of a light-emitting element according to the present invention.

FIG. 1 shows a light-emitting element having a hole-generating layer 111 between a first electrode 101 and a second electrode 102. A hole-transporting layer 112, a light-emitting layer 113, an electron-transporting layer 114, and an electron-generating layer 115 are provided between the hole-generating layer 111 and the second electrode 102. When a voltage is applied to the first electrode 101 and the second electrode 102 so that the potential of the first electrode 101 gets higher than that of the second electrode 102, holes are injected in the light-emitting layer 113 from the first electrode 101 side and electrons are injected in the light-emitting layer 113 from the second electrode 102 side. Then, the holes and electrons injected into the light-emitting layer 113 are recombined. The light-emitting layer 113 contains a light-emitting substance, which becomes an excitation state by excitation energy that is generated due to the recombination. The light-emitting substance emits light upon returning to a ground state from the excitation state.

The hole-generating layer 111 is a layer that is formed mixing an anthracene derivative represented by a general formula (1) or (2) and a substance that shows electron acceptability to the anthracene derivative. A light-emitting element that operates with long-term stability and with few defective elements due to oxidation reaction can be obtained by using the anthracene derivative thus represented by the general formula (1) or (2). This is because the anthracene derivative represented by the general formula (1) or (2) is superior in terms of resistance to the repetition of oxidation reaction and because the quality of the hole-generating layer 111 is hardly changed even when oxidation reaction is generated in the hole-generating layer 111. Note that increase in resistance or the like can be given as an example of the change of the hole-generating layer 111 in quality.

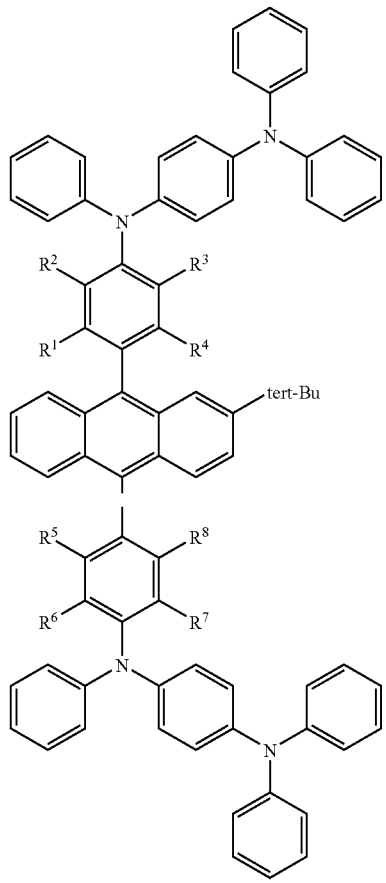

(1)

In the general formula (1), $R^1$ to $R^8$ are individually any one of hydrogen and an alkyl group having 1 to 4 carbon atoms, or $R^1$ and $R^2$, $R^3$ and $R^4$, $R^5$ and $R^6$, and $R^7$ and $R^8$ are individually bonded to from an aromatic ring. The bond of $R^1$ and $R^2$, the bond of $R^3$ and $R^4$, the bond of $R^5$ and $R^6$, and the bond of $R^7$ and $R^8$ are independent of one another.

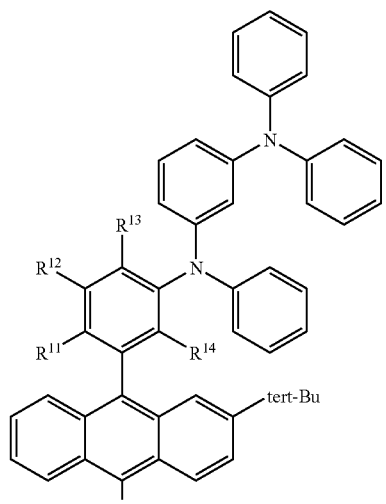

(2)

-continued

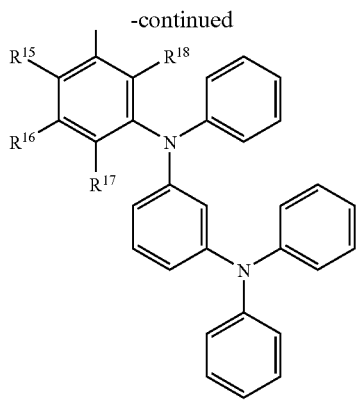

In the general formula (2), $R^{11}$ to $R^{18}$ are individually any one of hydrogen and an alkyl group having 1 to 4 carbon atoms, or $R^{11}$ and $R^{12}$, $R^{12}$ and $R^{13}$, $R^{15}$ and $R^{16}$, and $R^{16}$ and $R^{17}$ are individually bonded to from an aromatic ring. The bond of $R^{11}$ and $R^{12}$, the bond of $R^{12}$ and $R^{13}$, the bond of $R^{15}$ and $R^{16}$, and the bond of $R^{16}$ and $R^{17}$ are independent of one another.

Note that it is preferable to particularly use an anthracene derivative having hole mobility of $1\times10^{-6}$ cm$^2$/Vs in the anthracene derivative represented by the general formula (1) or (2). In addition, the substance that shows electron acceptability to the anthracene derivative represented by a general formula (1) or (2) is preferably contained so that the value of a molar ratio is 0.5 or more and 2 or less (=substance that shows electron acceptability/anthracene derivative) to the anthracene derivative represented by the general formula (1) or (2). Moreover, the substance that shows electron acceptability is not particularly limited; however, it is preferable to use at least one metal oxide of molybdenum oxide, vanadium oxide, ruthenium oxide, rhenium oxide, and the like. However, besides, metal oxide such as titanium oxide, chromium oxide, zirconium oxide, hafnium oxide, tantalum oxide, tungsten oxide, or silver oxide may also be used. By being combined with these metal oxides, crystallization of the hole-generating layer 111 can be suppressed and malfunction of an element due to the crystallization can be reduced. Note that, besides metal oxide, metal nitride, metal nitride oxide, or the like may also be used as long as electron acceptability is shown. In the hole-generating layer 111 having such a structure, an electron of the anthracene derivative represented by a general formula (1) or (2) is taken away by the substance that shows electron acceptability. In other words, the anthracene derivative represented by the general formula (1) or (2) is oxidized and then holes are generated.

In addition, the light-emitting layer 113 contains a light-emitting substance. The light-emitting substance mentioned above indicates a substance with favorable luminous efficiency exhibiting light emission of a desired wavelength. The light-emitting layer 113 may be a layer formed only of a light-emitting substance. However, when concentration quenching is occurred due to a concentration of a light-emitting substance itself, the light-emitting layer 113 is preferable to be a layer in which a light-emitting substance is mixed to be dispersed in a layer formed of a substance having an energy gap larger than that of a light-emitting substance. By containing a light-emitting substance in the light-emitting layer 113 by being dispersed, light emission can be prevented from being quenched due to the concentration. Here, the energy gap indicates an energy gap between the LUMO level and the HOMO level.

A light-emitting substance is not particularly limited, and it is only necessary to use a substance with favorable luminous efficiency exhibiting light emission of a desired wavelength. In order to obtain red light emission, for example, the following substances exhibiting emission spectrum with peaks of at 600 nm to 680 nm can be used as a light-emitting substance: 4-dicyanomethylene-2-isopropyl-6-[2-(1,1,7,7-tetramethyl-julolidine-9-yl)ethenyl]-4H-pyran (abbreviation: DCJTI); 4-dicyanomethylene-2-methyl-6-[2-(1,1,7,7-tetramethylju-lolidine-9-yl)ethenyl]-4H-pyran (abbreviation: DCJT); 4-dicyanomethylene-2-tert-butyl-6-[2-(1,1,7,7-tetramethyljulo-lidine-9-yl)ethenyl]-4H-pyran (abbreviation: DCJTB); periflanthen, 2,5-dicyano-1,4-bis[2-(1-methoxy-1,1,7,7-tetramethyljulolidine-9-yl)ethenyl]benzene; or the like. In order to obtain green light emission, substances exhibiting emission spectrum with peaks of at 500 nm to 550 nm such as N,N'-dimethylquinacridone (abbreviation: DMQd), coumarin 6, coumarin 545T, or tris(8-quinolinolato)aluminum (abbreviation: Alq$_3$) can be used as a light-emitting substance. In order to obtain blue light emission, the following substances exhibiting emission spectrum with peaks of at 420 nm to 500 nm can be used as a light-emitting substance: 9,10-bis(2-naphthyl)-tert-butylanthracene (abbreviation: t-BuDNA); 9,9'-bianthryl; 9,10-diphenylanthracene (abbreviation: DPA); 9,10-bis(2-naphthyl)anthracene (abbreviation: DNA); bis(2-methyl-8-quinolinolato)-4-phenylpheno-late-gallium (abbreviation: BGaq); bis(2-methyl-8-quinolinolato)-4-phenylphenolate-aluminum (abbreviation: BAlq); or the like. As mentioned above, as well as a substance that emits fluorescence, the following substance that emits phosphorescence can also be used as a light-emitting substance: bis[2-(3,5-bis(trifluoromethyl)phenyl)pyridinato-N, C$^{2'}$]iridium(III)picolinate (abbreviation: Ir(CF3ppy)$_2$(pic)); bis[2-(4,6-difluorophenyl)pyridinato-N,C$^2$]iridium(III) acetylacetonate (abbreviation: FIr(acac)); bis[2-(4,6-difluorophenyl)pyridinato-N,C$^2$]iridium(III)picolinate (abbreviation: FIr(pic)); tris(2-phenylpyridinato-N,C$^{2'}$)iridium (abbreviation: Ir(ppy)$_3$); or the like.

In addition, a substance that is contained in the light-emitting layer 113 along with a light-emitting substance and used to have a dispersed state of a light-emitting substance is not particularly limited. It is only necessary to select the substance appropriately in view of an energy gap or the like of a substance that is used as a light-emitting substance. For example, a metal complex such as bis[2-(2-hydroxyphenyl) pyridinato]zinc (abbreviation Znpp$_2$) or bis[2-(2-hydrox-yphenyl)benzoxazolate]zinc (abbreviation: Zn(BOX)$_2$) as well as an anthracene derivative such as 9,10-di(2-naphthyl)-2-tert-butylanthracene (abbreviation: t-BuDNA); a carbazole derivative such as 4,4'-bis(N-carbazoryl)biphenyl (abbreviation: CBP); a quinoxaline derivative such as 2,3-bis(4-diphe-nylaminophenyl)quinoxaline (abbreviation: TPAQn) or 2,3-bis{4-[N-(1-naphthyl)-N-phenylamino]phenyl}-dibenzo[f, h]quinoxaline (abbreviation: NPADiBzQn) can be used along with a light-emitting substance.

The hole-transporting layer 112 is a layer having a function to transport holes and, in a light-emitting element of this embodiment mode, has a function to transport holes from the hole-generating layer 111 to the light-emitting layer 113. By providing the hole-transporting layer 112, the distance between the hole-generating layer III and the light-emitting layer 113 can be separated. Consequently, light emission can be prevented from being quenched due to metal contained in the hole-generating layer 111. The hole-transporting layer 112 is preferable to be formed using a substance having high hole transportability and particularly preferable to be formed using a substance having hole mobility of $1\times10^{-6}$ cm$^2$/Vs or more. Note that the substance having high hole transportability indicates a substance in which hole mobility is higher than electron mobility and a value of a ratio of the hole mobility to the electron mobility (=hole mobility/electron mobility) is more than 100. The following can be given as a specific example of a substance that can be used to form the hole-transporting layer, 112: 4,4'-bis[N-(1-naphtyl)-N-phenylamino]biphenyl (abbreviation: NPB); 4,4'-bis[N-(3-methylphenyl)-N-phenylamino]biphenyl (abbreviation: TPD); 4,4',4''-tris(N,N-diphenylamino)triphenylamine (abbreviation: TDATA); 4,4',4''-tris[N-(3-methylphenyl)-N-phenylamino]triphenylamine (abbreviation: MTDATA); 4,4'-bis{N-[4-(N,N-di-m-tolylamino)phenyl]-N-phenylamino}biphenyl (abbreviation: DNTPD); 1,3,5-tris[N,N-di(m-tolyl)amino]benzene (abbreviation: m-MTDAB); 4,4',4''-tris(N-carbazolyl)triphenylamine (abbreviation: TCTA); phthalocyanine (abbreviation: H$_2$Pc); copper phthalocyanine (abbreviation: CuPc); vanadylphthalocyanine (abbreviation: VOPc); and the like.

The electron-transporting layer 114 is a layer having a function to transport electrons and, in a light-emitting element of this embodiment mode, has a function to transport electrons from the electron-generating layer 115 to the light-emitting layer 113. By providing the electron-transporting layer 114, the distance between the second electrode 102 and the light-emitting layer 113 can be separated. Consequently, light emission can be prevented from being quenched due to metal contained in the second electrode 102. The electron-transporting layer 114 is preferable to be formed using a substance having high electron transportability and particularly preferable to be formed using a substance having electron mobility of $1\times10^{-6}$ cm$^2$/Vs or more. Note that the substance having high hole transportability indicates a substance in which electron mobility is higher than hole mobility and a value of a ratio of the electron mobility to the hole mobility (=electron mobility/hole mobility) is more than 100. The following can be given as a specific example of a substance that can be used to form the electron-transporting layer 114: 2-(4-biphenylyl)-5-(4-tert-buthylphenyl)-1,3,4-oxadiazole (abbreviation: PBD); 1,3-bis[5-(p-tert-buthylphenyl)-1,3,4-oxadiazole-2-yl]benzene (abbreviation: OXD-7); 3-(4-tert-buthylphenyl)-4-phenyl-5-(4-biphenylyl)-1,2,4-triazole (abbreviation: TAZ); 3-(4-tert-buthylphenyl)-4-(4-ethylphenyl) 5-(4-biphenylyl)-1,2,4-triazole (abbreviation: p-EtTAZ); bathophenanthroline (abbreviation: BPhen); bathocuproin (abbreviation: BCP); 4,4-bis(5-methylbenzoxazol-2-yl)stilbene (abbreviation: BzOs); and the like as well as a metal complex such as tris(8-quinolinolato)aluminum (abbreviation: Alq$_3$); tris(4-methyl-8-quinolinolato)aluminum (abbreviation: Almq$_3$); bis(10-hydroxybenzo[h]-quinolinato)berylium (abbreviation: BeBq$_2$); bis(2-methyl-8-quinohnolato)-4-phenylphenolate-aluminum (abbreviation: BAlq); bis[2-(2-hydroxyphenyl)benzoxazolate]zinc (abbreviation: Zn(BOX)$_2$); and bis[2-(2-hydroxyphenyl)benzothiazorato] zinc (abbreviation: Zn(BTZ)$_2$).

Note that the hole-transporting layer 112 and the electron-transporting layer 114 may be each formed using a bipolar substance in addition to the above substances. The bipolar substance indicates the following substance: when mobility of either carrier of an electron or a hole is compared with mobility of the other carrier, a value of a ratio of one carrier mobility to the other carrier mobility is 100 or less, preferably 10 or less. As for the bipolar substance, for example, 2,3-bis (4-diphenylaminophenyl)quinoxaline (abbreviation: TPAQn); 2,3-bis{4-[N-(1-naphthyl)-N-phenylamino]phenyl}-dibenzo[f,h]quinoxaline (abbreviation: NPADiBzQn); and the like can be given. It is preferable to particularly use a substance of which hole and electron mobility are each $1\times10^{-6}$ cm$^2$/Vs or more in the bipolar substance. In addition, the hole-transporting layer 112 and the electron-transporting layer 114 may be formed using the same bipolar substance.

The electron-generating layer 115 is a layer for generating electrons, which can be formed mixing at least one substance of a substance having high electron transportability and a bipolar substance with a substance that shows electron-donating properties to these substances. Here, it is preferable to particularly use a substance having electron mobility of $1\times10^{-6}$ cm$^2$/Vs or more in the substance having high electron transportability and the bipolar substance. As for the substance having high electron transportability and the bipolar substance, the above substances can be used for each. In addition, as for the substance that shows electron-donating properties, a substance of alkaline metal or alkaline earth metal, specifically lithium (Li), calcium (Ca), natrium (Na), potassium (K), magnesium (Mg), or the like can be used. Moreover, alkaline metal oxide or alkaline earth metal oxide, specifically at least one substance of lithium oxide (Li$_2$O), calcium oxide (CaO), natrium oxide (Na$_2$O), potassium oxide (K$_2$O), magnesium oxide (MgO), and the like can also be used as the substance that shows electron-donating properties. Further, alkaline metal fluoride or alkaline earth metal fluoride, specifically at least one substance of lithium fluoride (LiF), cesium fluoride (CsF), calcium fluoride (CaF$_2$), and the like can also be used as the substance that shows electron-donating properties. Furthermore, alkaline metal nitride, alkaline earth metal nitride, or the like, specifically at least one substance of calcium nitride, magnesium nitride, and the like can also be used as the substance that shows electron-donating properties.

The first electrode 101 may be formed using a substance having a high work function such as gold (Au), platinum (Pt), nickel (Ni), tungsten (W), chromium (Cr), molybdenum (Mo), iron (Fe), cobalt (Co), copper (Cu), palladium (Pd), or tantalum nitride as well as indium tin oxide, indium tin oxide containing silicon oxide, or indium oxide containing zinc oxide (ZnO). Alternatively, the first electrode 101 may also be formed using a substance having a low work function such as aluminum or magnesium. In this manner, the first electrode 101 can be formed without depending on a work function of a substance in a light-emitting element of this embodiment mode. This is because the hole-generating layer 111 is provided between the first electrode 101 and the light-emitting layer 113.

In addition, the second electrode 102 may also be formed using a substance having a high work function such as gold (Au), platinum (Pt), nickel (Ni), tungsten (W), chromium (Cr), molybdenum (Mo), iron (Fe), cobalt (Co), copper (Cu), palladium (Pd), or tantalum nitride as well as indium tin oxide, indium tin oxide containing silicon oxide, or indium oxide containing zinc oxide (ZnO). Alternatively, the second electrode 102 may also be formed using a substance having a low work function such as aluminum or magnesium. In this manner, the second electrode 102 can be formed without depending on a work function of a substance in a light-emitting element of this embodiment mode. This is because the electron-generating layer 111 is provided between the second electrode 102 and the light-emitting layer 113.

Figure 3:
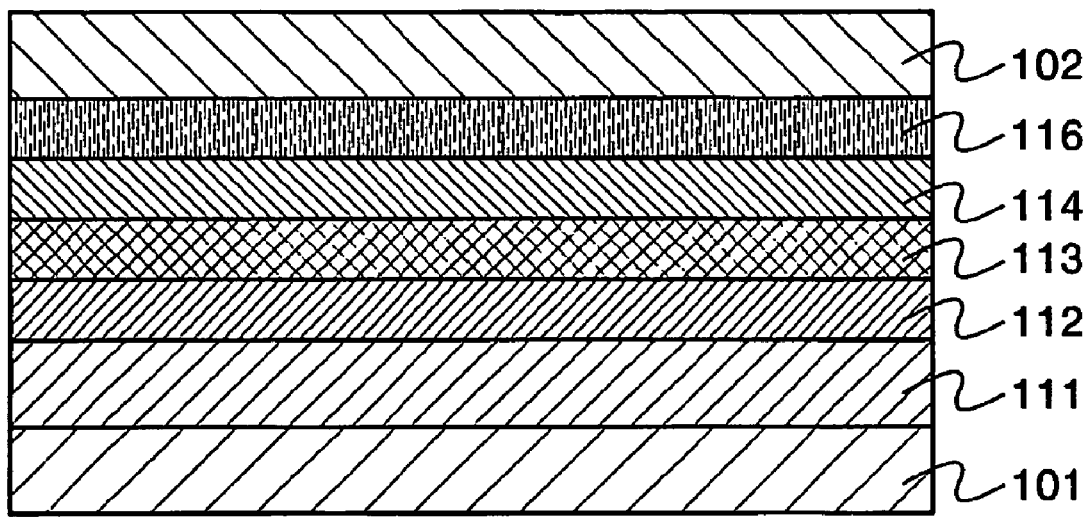
FIG. 3 is a diagram explaining one example of a light-emitting element according to the present invention.

Note that this embodiment mode shows a light-emitting element having the hole-transporting layer 112, the electron-transporting layer 114, and the like as well as the hole-generating layer 111 and the light-emitting layer 113; however, a mode of a light-emitting element is not necessarily limited thereto. For example, a light-emitting element in which an electron-injecting layer 116 is provided instead of the electron-generating layer 115 as shown in FIG. 3 may be employed. The electron-injecting layer 116 is a layer having a function to assist electrons to be injected to the electron-transporting layer 114 from the second electrode 102. By providing the electron-injecting layer 116, electron affinity difference between the second electrode 102 and the electron-transporting layer 114 is relieved; thus, electrons are easily injected. The electron-injecting layer 116 is preferably formed using a substance of which electron affinity is higher than that of a substance forming the electron-transporting layer 114 and lower than that of a substance forming the second electrode 102. Or the electron-injecting layer 116 is preferably formed using a substance of which energy band curves by being provided as a thin film of 1 nm to 2 nm between the electron-transporting layer 114 and the second electrode 102. The following can be given as a specific example of a substance that can be used to form the electron-injecting layer 116: inorganic matter such as alkaline metal, alkaline earth metal, fluoride of alkaline metal, fluoride of alkaline earth metal, oxide of alkaline metal, or oxide of alkaline earth metal. These substances are preferable because the energy band curves by being provided as a thin film. In addition to the inorganic matter, a substance that can be used to form the electron-transporting layer 114 such as BPhen, BCP, p-EtTAZ, or TAZ can also be used as a substance for forming the electron-injecting layer 116. And the electron-injecting layer 116 is preferably formed by using a substance of which electron affinity is higher than that of a substance for forming the electron-transporting layer 114 among these substances. In other words, the electron-injecting layer 116 can be formed by having relatively higher electron affinity than the electron-transporting layer 114. Note that the second electrode 102 is preferably formed using a substance having a low work function such as aluminum in the case of providing the electron-injecting layer 116.

Figure 4:
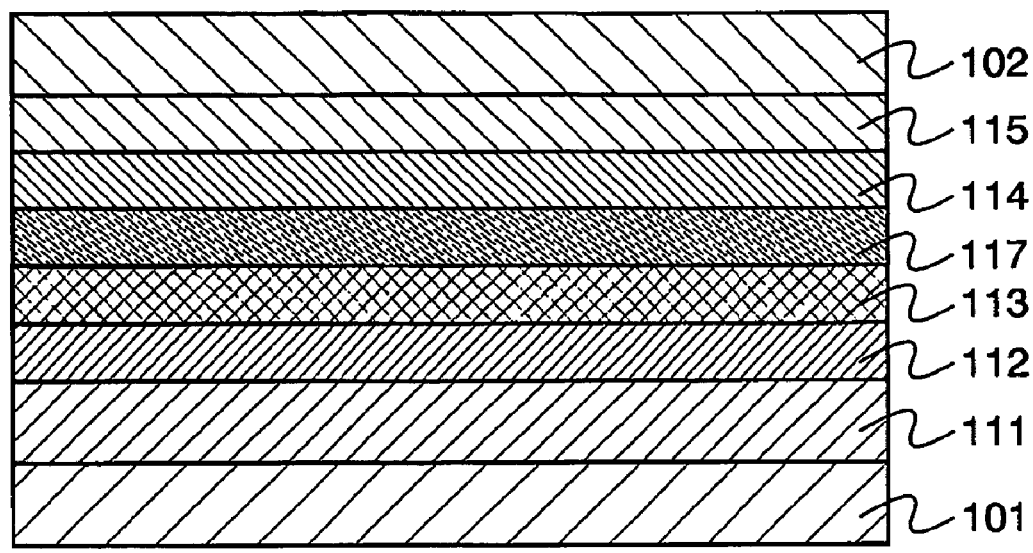
FIG. 4 is a diagram explaining one example of a light-emitting element according to the present invention.

In addition, a hole-blocking layer 117 may be provided between the light-emitting layer 113 and the electron-transporting layer 114 as shown in FIG. 4. By providing the hole-blocking layer 117, a hole can be prevented from flowing to a second electrode 102 after passing through the light-emitting layer 113; thus, recombination efficiency of a carrier can be increased. Moreover, excitation energy generated in the light-emitting layer 113 can be prevented from having moved to other layers such as an electron-transporting layer 114. The hole-blocking layer 117 can be formed by particularly using a substance of which ionization potential and excitation energy are higher than those of a substance that is used to form the light-emitting layer 113 among a substance that can be used to form the electron-transporting layer 114 such as BAlq, OXD-7, TAZ, or BPhen. In other words, it is only necessary that the hole-blocking layer 117 is formed so that ionization potential in the hole-blocking layer 117 is relatively higher than that in the electron-transporting layer 114. In the same manner, a layer for blocking an electron from flowing to a first electrode 101 after passing through the light-emitting layer 113 may also be provided between the light-emitting layer 113 and a hole-transporting layer 112.

Note that whether the hole-transporting layer 112 and the electron-transporting layer 114 are to be provided or not is appropriately decided by a practitioner of the present invention, and these layers are not always have to be provided when there is no defect such as quenching due to metal even when the hole-transporting layer 112 and the electron-transporting layer 114 are not provided, for example.

A light-emitting element set forth above is accompanied with little change in a drive voltage that depends on a thickness of the hole-generating layer 111. Therefore, a distance between the light-emitting layer 113 and the first electrode 101 can be adjusted easily by changing a thickness of the hole-generating layer 111. In other words, a length of a light path where emitted light passes (light path length) is adjusted easily so as to have a length enough to extract light emission outside efficiently or a length having preferable color purity of light emission that is extracted outside. In addition, unevenness of a surface of the first electrode 101 can be relieved easily and a short circuit between the electrodes can be prevented easily by having a thick thickness of the hole-generating layer 111.

In addition, a light-emitting element of the present invention is accompanied with little change in a drive voltage that depends on a thickness of an electron-generating layer 115. Therefore, a length of a light path where emitted light passes (light path length) is adjusted easily by changing a thickness of the electron-generating layer 115. Moreover, unevenness of a surface of the second electrode 102 can be relieved easily and a short circuit between the electrodes can be prevented easily by having a thick thickness of the electron-generating layer 115.

Embodiment Mode 2

An example of a light-emitting element of the present invention will be explained with reference to FIG. 2.

Figure 2:
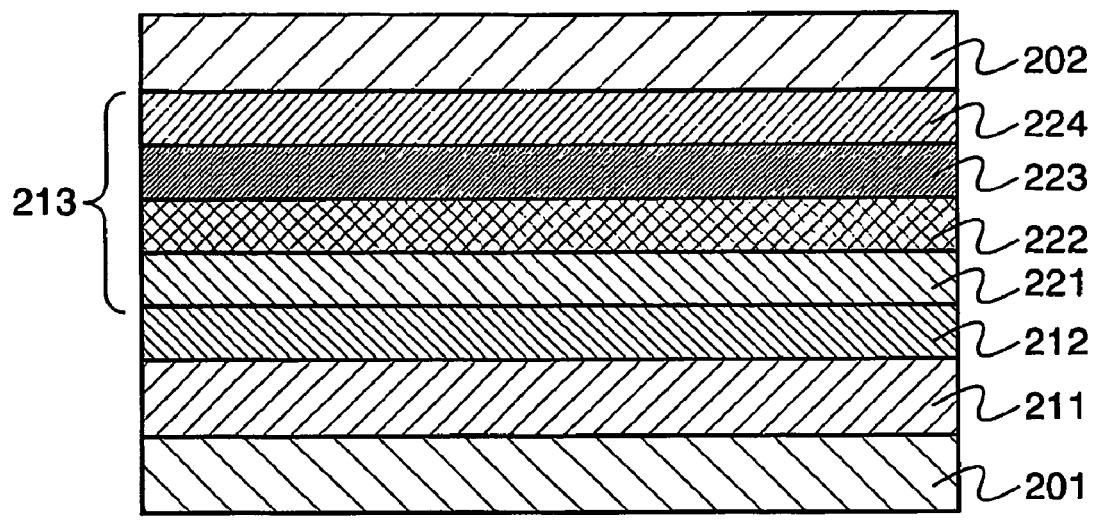
FIG. 2 is a diagram explaining one example of a light-emitting element according to the present invention.

FIG. 2 shows a light-emitting element having a first layer 211, a second layer 212, and a third layer 213 between a first electrode 201 and a second electrode 202. The first layer 211 generates holes, and the second layer 212 generates electrons. The third layer 213 is formed by being sequentially stacked with an electron-transporting layer 221, a light-emitting layer 222, a hole-transporting layer 223, and a hole-generating layer 224. Here, the hole-generating layer 224 is provided nearer the second electrode 202 side than the light-emitting layer 222, and the electron-transporting layer 221 is provided nearer the first electrode 201 side than the light-emitting layer 222. When a voltage is applied to the first electrode 201 and the second electrode 202 so that the potential of the first electrode 201 gets higher than that of the second electrode 202, holes are injected in the first electrode 201 from the first layer 211. In addition, electrons are injected in the third layer 213 from the second layer 212 and holes are injected from the second electrode 202. The holes and electrons injected into the third layer 213 are recombined in the light-emitting layer 222. The light-emitting layer 222 contains a light-emitting substance, which becomes an excitation state by excitation energy that is generated due to the recombination. The light-emitting substance emits light upon returning to a ground state from the excitation state.

The first layer 211 and the hole-generating layer 224 are each a layer that is formed mixing an anthracene derivative represented by a general formula (1) or (2) and a substance that shows electron acceptability to the anthracene derivative. In the first layer 211 and the hole-generating layer 224, an electron of the anthracene derivative represented by the general formula (1) or (2) is taken away by the substance that shows electron acceptability. In other words, the anthracene derivative represented by a general formula (1) or (2) is oxidized and then holes are generated.

(1)

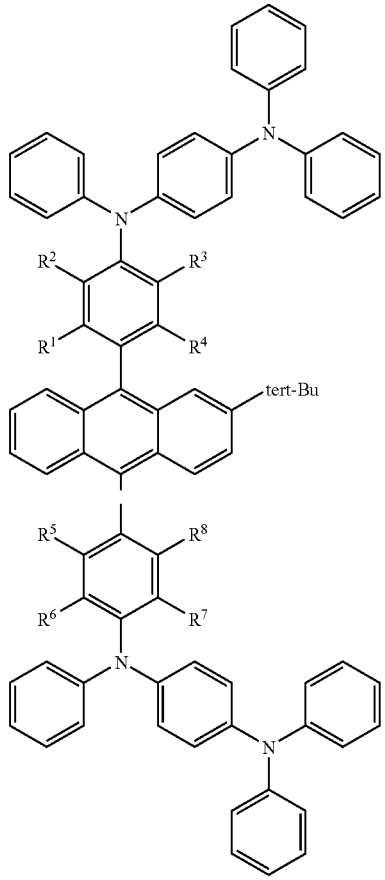

In the general formula (1), $R^1$ to $R^8$ are individually any one of hydrogen and an alkyl group having 1 to 4 carbon atoms, or $R^1$ and $R^2$, $R^3$ and $R^4$, $R^5$ and $R^6$, and $R^7$ and $R^8$ are individually bonded to from an aromatic ring. The bond of $R^1$ and $R^2$, the bond of $R^3$ and $R^4$, the bond of $R^5$ and $R^6$, and the bond of $R^7$ and $R^8$ are independent of one another.

(2)

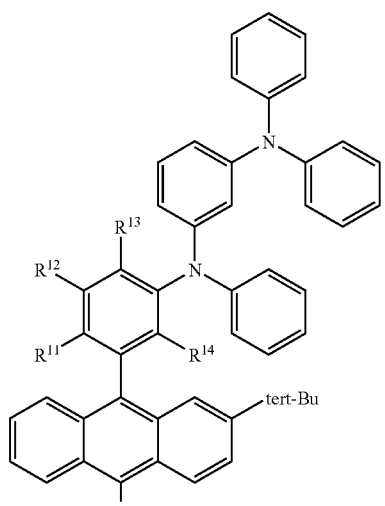

-continued

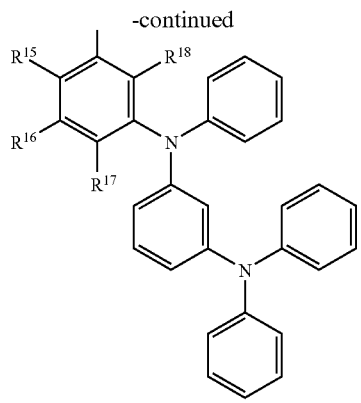

In the general formula (2), $R^{11}$ to $R^{18}$ are individually any one of hydrogen and an alkyl group having 1 to 4 carbon atoms, or $R^{11}$ and $R^{12}$, $R^{12}$ and $R^{13}$, $R^{15}$ and $R^{16}$, and $R^{16}$ and $R^{17}$ are individually bonded to from an aromatic ring. The bond of $R^{11}$ and $R^{12}$, the bond of $R^{12}$ and $R^{13}$, the bond of $R^{15}$ and $R^{16}$, and the bond of $R^{16}$ and $R^{17}$ are independent of one another.

In this manner, since the first layer 211 and the hole-generating layer 224 are formed using the anthracene derivative represented by a general formula (1) or (2), a light-emitting element of this embodiment mode operates with long-term stability and with few defective elements due to oxidation reaction. This is because the anthracene derivative represented by a general formula (1) or (2) is superior in terms of resistance to the repetition of oxidation reaction and because the quality of the first layer 211 or the hole-generating layer 224 is hardly changed even when oxidation reaction is generated in the first layer 211 or the hole-generating layer 224. Note that increase in resistance or the like can be given as an example of the change of the hole-generating layer 224 in quality.

Note that it is preferable to particularly use an anthracene derivative having hole mobility of $1 \times 10^{-6}$ cm$^2$/Vs in the anthracene derivative represented by the general formula (1) or (2) for each of the first layer 211 and the hole-generating layer 224. In addition, the substance that shows electron acceptability to the anthracene derivative represented by the general formula (1) or (2) is preferably contained in each layer so that the value of a molar ratio is 0.5 or more and 2 or less (=substance that shows electron acceptability/anthracene derivative) to the anthracene derivative represented by the general formula (1) or (2). Moreover, the substance that shows electron acceptability is not particularly limited; however, it is preferable to use metal oxide such as molybdenum oxide, vanadium oxide, ruthenium oxide, or rhenium oxide. However, besides, titanium oxide, chromium oxide, zirconium oxide, hafnium oxide, tantalum oxide, tungsten oxide, silver oxide, or the like may also be used. By being combined with these metal oxides, crystallization of the first layer 211 or the hole-generating layer 224 can be suppressed and malfunction of an element due to the crystallization can be reduced. Note that, besides metal oxide, metal nitride, metal nitride oxide, or the like may also be used as long as electron acceptability is shown.

The second layer 212 is a layer for generating electrons, which can be formed mixing at least one substance having high electron transportability and a bipolar substance with a substance that shows electron-donating properties to these substances. Here, it is preferable to particularly use a substance having electron mobility of $1\times10^{-6}$ cm$^2$/Vs or more in the substance having high electron transportability and the bipolar substance. As for the substance having high electron transportability and the bipolar substance, the above substances can be used for each. In addition, as for the substance that shows electron-donating properties, a substance of one or more of alkaline metal and alkaline earth metal, specifically lithium (Li), calcium (Ca), natrium (Na), potassium (K), magnesium (Mg), and the like can be used. Moreover, alkaline metal oxide and alkaline earth metal oxide, specifically at least one substance of lithium oxide (Li$_2$O), calcium oxide (CaO), natrium oxide (Na$_2$O), potassium oxide (K$_2$O), magnesium oxide (MgO), and the like can also be used as the substance that shows electron-donating properties. Further, alkaline metal fluoride and alkaline earth metal fluoride, specifically at least one substance of lithium fluoride (LiF), cesium fluoride (CsF), calcium fluoride (CaF$_2$), and the like can also be used as the substance that shows electron-donating properties. Furthermore, alkaline metal nitride, alkaline earth metal nitride, or the like, specifically at least one substance of calcium nitride, magnesium nitride, and the like can also be used as the substance that shows electron-donating properties.

The electron-transporting layer 221 is a layer having a function to transport electrons and, in a light-emitting element of this embodiment mode, has a function to transport electrons from the second layer 212 to the light-emitting layer 222. By providing the electron-transporting layer 221, the distance between the second layer 212 and the light-emitting layer 222 can be separated. Consequently, light emission can be prevented from being quenched due to metal contained in the second layer 212. The electron-transporting layer 221 is preferable to be formed using a substance having high electron transportability and particularly preferable to be formed using a substance having electron mobility of $1\times10^{-6}$ cm$^2$/Vs or more. As for a specific example of a substance that can be used to form the electron-transporting layer 221, the description of a specific example of a substance that can be used to form the electron-transporting layer 114 in Embodiment Mode 1 is applied correspondingly.

The light-emitting layer 222 contains a light-emitting substance. The light-emitting layer 113 may be a layer formed only of a light-emitting substance. However, when concentration quenching is occurred, the light-emitting layer 222 is preferable to be a layer in which a light-emitting substance is mixed to be dispersed in a layer formed of a substance having an energy gap larger than that of a light-emitting substance. By containing a light-emitting substance in the light-emitting layer 222 by being dispersed, light emission can be prevented from being quenched due to the concentration. Here, as for a substance that is contained in the light-emitting layer 222 along with a light-emitting substance and used to have a dispersed state of a light-emitting substance, the description, mentioned in Embodiment Mode 1, of a substance that is contained in the light-emitting layer 113 along with a light-emitting substance and used to have a dispersed state of a light-emitting substance is applied correspondingly.

The hole-transporting layer 223 is a layer having a function to transport holes and, in a light-emitting element of this embodiment mode, has a function to transport holes from the hole-generating layer 224 to the light-emitting layer 222. By providing the hole-transporting layer 223, the distance between the hole-generating layer 224 and the light-emitting layer 222 can be separated. Consequently, light emission can be prevented from being quenched due to metal contained in the hole-generating layer 224. The hole-transporting layer 223 is preferable to be formed using a substance having high hole transportability and particularly preferable to be formed using a substance having hole mobility of $1\times10^{-6}$ cm$^2$/Vs or more. As for a specific example of a substance that can be used to form the hole-transporting layer 223, the description of a specific example of a substance that can be used to form the hole-transporting layer 112 in Embodiment Mode 1 is applied correspondingly.

The first electrode 201 may be formed using a substance having a high work function such as gold (Au), platinum (Pt), nickel (Ni), tungsten (W), chromium (Cr), molybdenum (Mo), iron (Fe), cobalt (Co), copper (Cu), palladium (Pd), or tantalum nitride as well as indium tin oxide, indium tin oxide containing silicon oxide, or indium oxide formed using a target mixed with 2 wt. % to 20 wt. % of zinc oxide (ZnO). Alternatively, the first electrode 201 may also be formed using a substance having a low work function such as aluminum or magnesium. In this manner, the first electrode 201 can be formed without depending on a work function of a substance in a light-emitting element of this embodiment mode. This is because the first layer 211 and the second layer 212 are provided between the first electrode 201 and the light-emitting layer 222.

In addition, the second electrode 202 may also be formed using a substance having a high work function such as gold (Au), platinum (Pt), nickel (Ni), tungsten (W), chromium (Cr), molybdenum (Mo), iron (Fe), cobalt (Co), copper (Cu), palladium (Pd), or tantalum nitride as well as indium tin oxide, indium tin oxide containing silicon oxide, or indium oxide containing zinc oxide (ZnO). Alternatively, the second electrode 202 may also be formed using a substance having a low work function such as aluminum or magnesium. In this manner, the second electrode 202 can be formed without depending on a work function of a substance in a light-emitting element of this embodiment mode. This is because the hole-generating layer 224 is provided between the second electrode 202 and the light-emitting layer 222.

Figure 5:
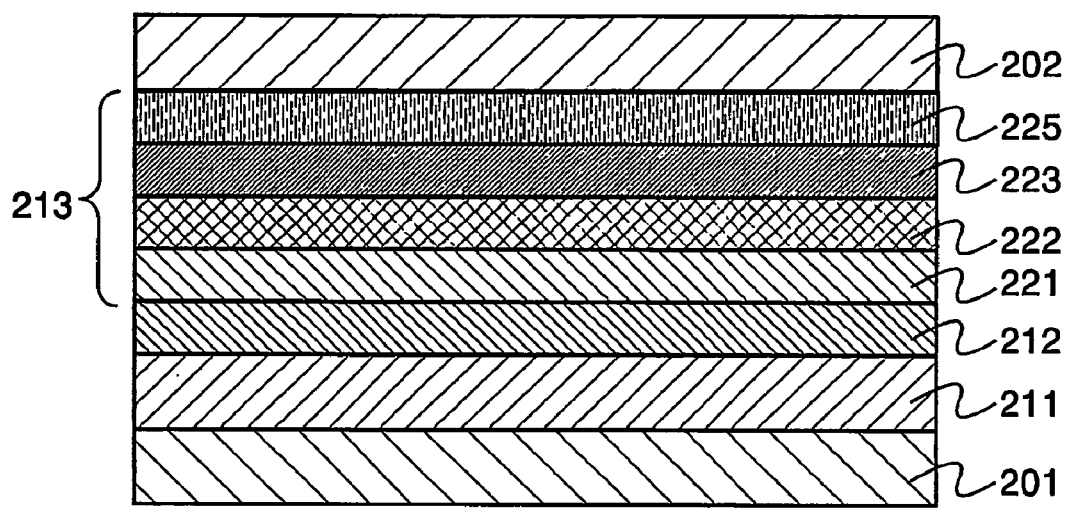
FIG. 5 is a diagram explaining one example of a light-emitting element according to the present invention.

Note that this embodiment mode shows a light-emitting element in which the third layer 213, a layer containing a light-emitting substance, is a multilayer including the electron-transporting layer 221, the light-emitting layer 222, the hole-transporting layer 223, and the hole-generating layer 224; however, a mode of a light-emitting element is not necessarily limited thereto. For example, a light-emitting element in which a hole-injecting layer 225 is provided instead of the hole-generating layer 224 as shown in FIG. 5 may be employed. The hole-injecting layer 225 is a layer having a function to assist electrons to be injected to the hole-transporting layer 223 from the second electrode 202. By providing the hole-injecting layer 225, ionization potential difference between the second electrode 202 and the hole-transporting layer 223 is relieved; thus, holes are easily injected. The hole-injecting layer 225 is preferably formed using a substance of which ionization potential is higher than that of a substance forming the hole-transporting layer 223 and lower than that of a substance forming the second electrode 202 or using a substance of which energy band curves by being provided as a thin film of 1 nm to 2 nm between the hole-transporting layer 223 and the second electrode 202. As for a specific example of a substance that can be used to form the hole-injecting layer 225, a phthalocyanine-based compound such as phthalocyanine (abbreviation: H$_2$Pc) or copper phthalocyanine (CuPc), a high molecular weight material such as poly (ethylenedioxythiophene)/poly (styrenesulfonic acid) solution (PEDOT/PSS), and the like can be given. By using these substances, the hole-injecting layer 225 can be formed by having relatively higher ionization potential than the hole-transporting layer 223 and relatively lower ionization potential than a substance forming the second electrode 202. Note that the second electrode 202 is preferably formed using a substance having a high work function such as indium tin oxide in the case of providing the hole-injecting layer 225.

Figure 6:
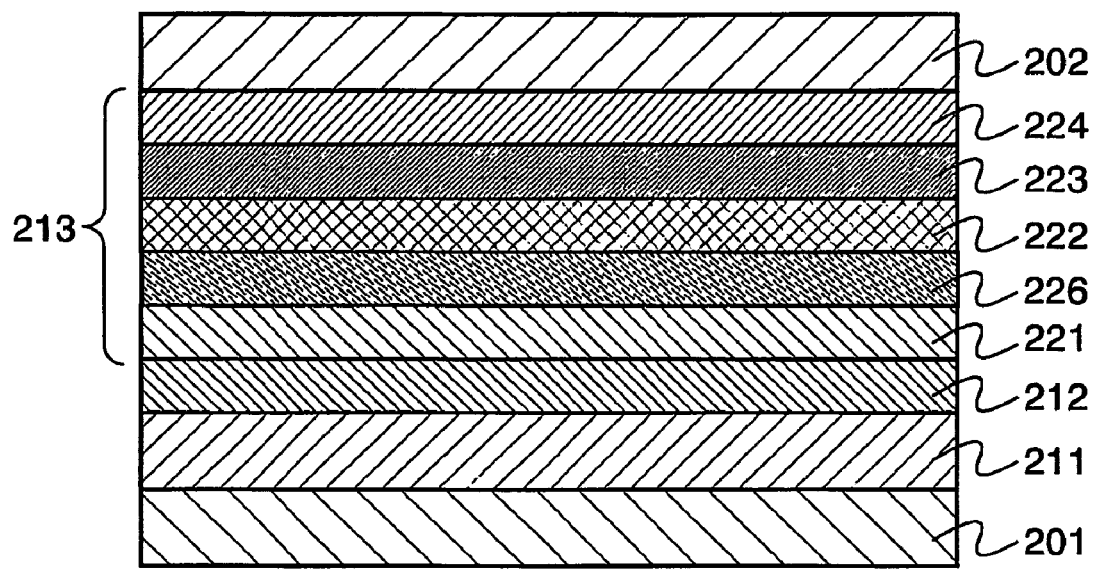
FIG. 6 is a diagram explaining one example of a light-emitting element according to the present invention.

In addition, a hole-blocking layer 226 may be provided between the light-emitting layer 222 and the electron-transporting layer 221 as shown in FIG. 6. By providing the hole-blocking layer 226, a hole can be prevented from flowing to a first electrode 201 after passing through the light-emitting layer 222; thus, recombination efficiency of a carrier can be increased. Moreover, excitation energy generated in the light-emitting layer 222 can be prevented from having moved to other layers such as an electron-transporting layer 221. The hole-blocking layer 226 can be formed by particularly using a substance of which ionization potential and excitation energy are higher than those of a substance that is used to form the light-emitting layer 222 among a substance that can be used to form the electron-transporting layer 221 such as BAlq, OXD-7, TAZ, or BPhen. In other words, it is only necessary that the hole-blocking layer 226 is formed so that ionization potential in the hole-blocking layer 226 is relatively higher than that in the electron-transporting layer 221. In the same manner, a layer for blocking an electron from flowing to a second electrode 202 after passing through the light-emitting layer 222 may also be provided between the light-emitting layer 222 and a hole-transporting layer 223.

Note that whether the hole-transporting layer 223 and the electron-transporting layer 221 are to be provided or not is appropriately decided by a practitioner of the present invention, and these layers are not always have to be provided when there is no defect such as quenching due to metal even when the hole-transporting layer 223 and the electron-transporting layer 221 are not provided, for example.

In addition, in a light-emitting element as set forth above, difference between electron affinity of a substance having high electron transportability that is contained in the second layer 212 and electron affinity of a substance contained in a layer in contact with the second layer 212 among the layers contained in the third layer 213 is preferably 2 eV or less, much preferably 1.5 eV or less. More specifically, as the case of a light-emitting element shown in FIG. 2, when the second layer 212 and the electron-transporting layer 221 are in contact with each other, the electron affinity difference between a substance having electron transportability that is contained in the second layer 212 and a substance having electron transportability that is contained in the electron-transporting layer 221 is preferably 2 eV or less, much preferably 1.5 eV or less. In this manner, electrons can be injected efficiently into the third layer 213 from the second layer 212 by bonding the second layer 212 and the third layer 213.

A light-emitting element as set forth above is accompanied with little change in a drive voltage that depends on a thickness of the first layer 211 and the hole-generating layer 224. Therefore, a distance between the light-emitting layer 222 and the first electrode 201 or the second electrode 202 can be adjusted easily by changing a thickness of the first layer 211 or the hole-generating layer 224. In other words, a length of a light path where emitted light passes (light path length) is adjusted easily so as to have a length enough to extract light emission outside efficiently or a length having preferable color purity of light emission that is extracted outside. In addition, unevenness of a surface of the first electrode 201 or the second electrode 202 can be relieved easily and a short circuit between the electrodes can be prevented easily by having a thick thickness of the first layer 211 or the hole-generating layer 224.

Embodiment Mode 3

A light-emitting element of the present invention can reduce malfunction due to oxidation and crystallization of a compound. In addition, a short circuit between electrodes can be prevented by having a thick thickness of a hole-generating layer. Moreover, by changing a thickness of a hole-generating layer, light path length can be adjusted, efficiency in extracting light emission outside can be improved, or light emission with preferable color purity can be obtained. Therefore, a preferable light-emitting device with few display defects due to malfunction of a light-emitting element can be obtained by using a light-emitting element of the present invention as a pixel. In addition, a light-emitting device capable of providing an image with a preferable display color can be obtained by using a light-emitting element of the present invention as a pixel. Moreover, a light-emitting device capable of lighting preferably with few defects due to malfunction of light-emitting element can be obtained by using a light-emitting element of the present invention as a light source.

Figure 11A:
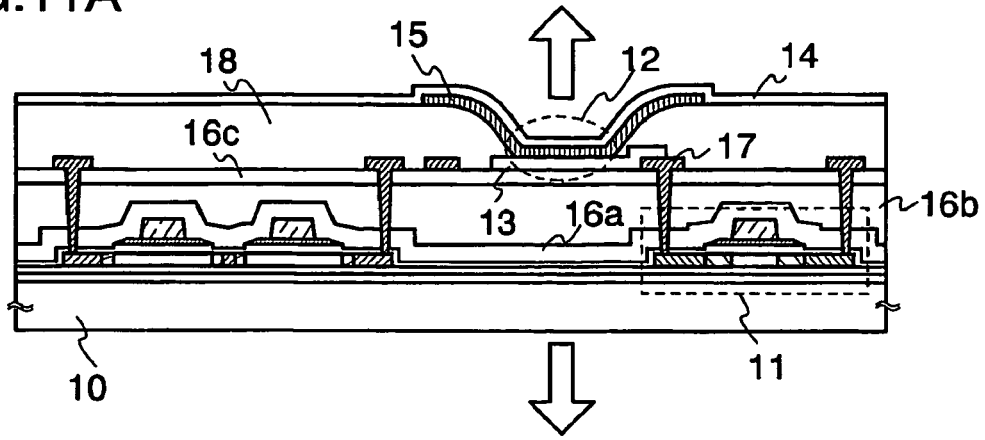
FIGS. 11A to 11C are views each explaining one example of a cross section of a light-emitting device according to the present invention.
Figure 11B:
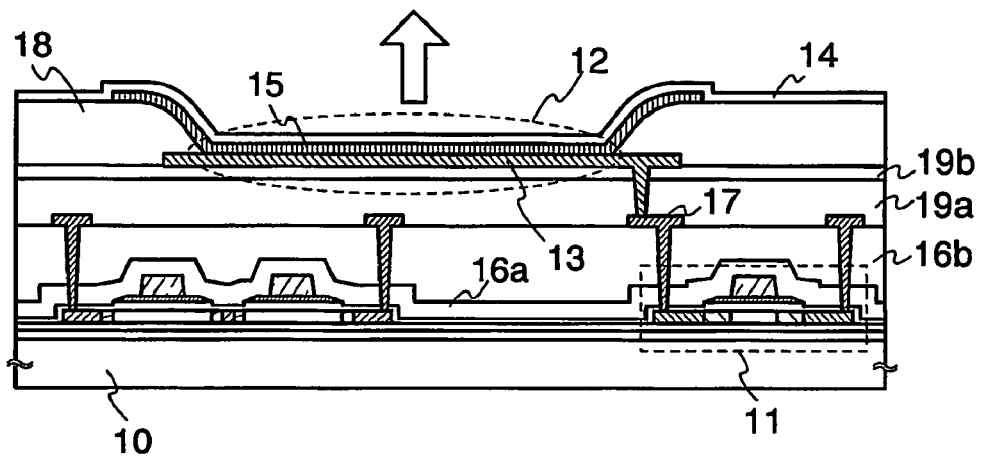
Figure 11C:
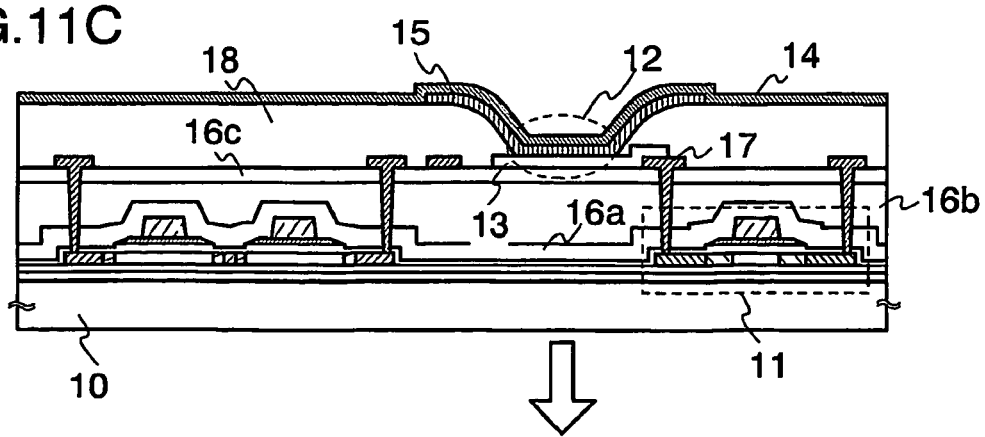

This embodiment mode will explain a circuit configuration of a light-emitting device having a display function and a method for driving thereof with reference to 7 to 10 and FIGS. 11A to 11C.

Figure 7:
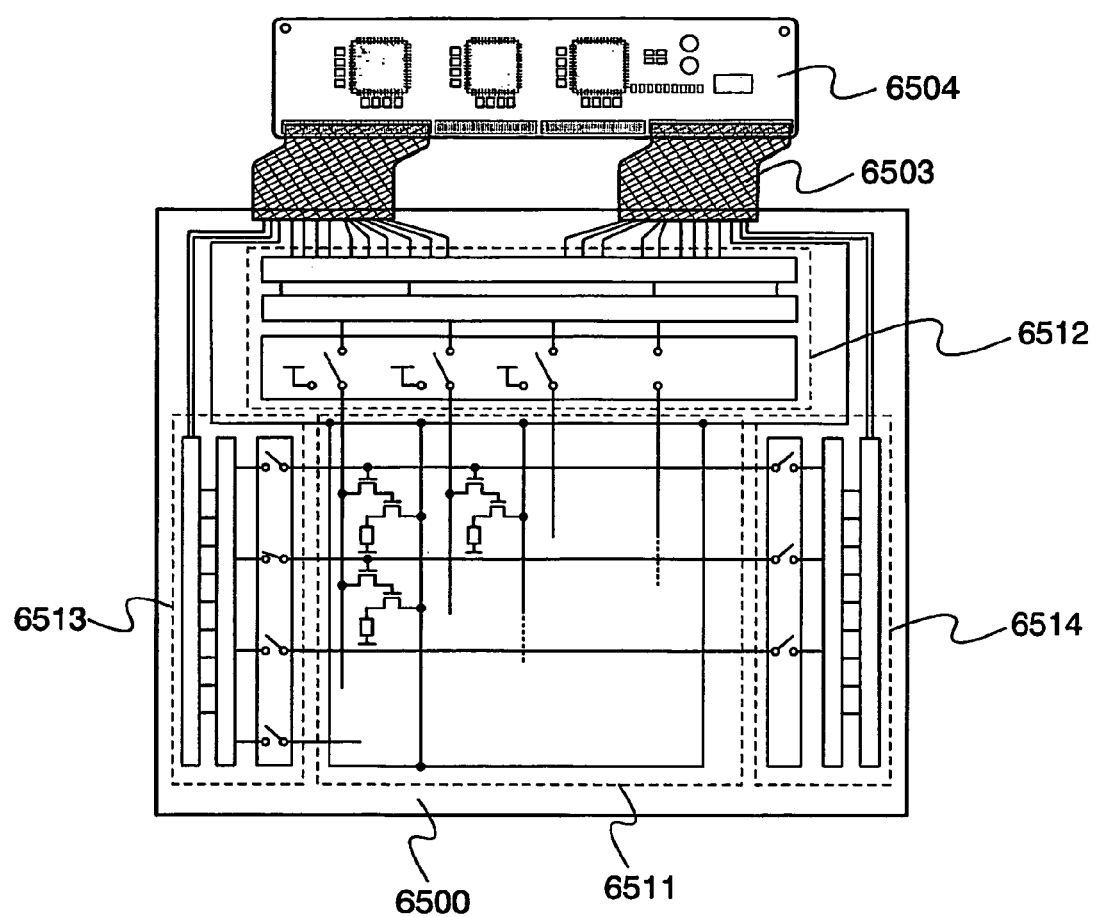
FIG. 7 is a top diagram explaining one example of a light-emitting element according to the present invention.

FIG. 7 is a schematic block diagram viewed from a top face of a light-emitting device according to the present invention. In FIG. 7, a pixel portion 6511, a source-signal line driver circuit 6512, a writing gate-signal line driver circuit 6513, and an erasing gate-signal line driver circuit 6514 are provided over a substrate 6500. The source-signal line driver circuit 6512, the writing gate-signal line driver circuit 6513, and the erasing gate-signal line driver circuit 6514 are connected to FPCs (flexible printed circuits) 6503 that are external input terminals through wiring groups, respectively. The source-signal line driver circuit 6512, the writing gate-signal line driver circuit 6513, and the erasing gate-signal line driver circuit 6514 respectively receive video signals, clock signals, start signals, reset signals and the like from the FPCs 6503. The FPCs 6503 are attached with a printed-wiring board (PWB) 6504. Note that a driver circuit portion is not necessary to be provided over the same substrate as the pixel portion 6511 as mentioned above. For example, the driver circuit portion may be provided outside of the substrate by utilizing an FPC with a wiring pattern on which an IC chip is mounted (TCP), or the like.

In the pixel portion 6511, a plurality of source-signal lines extending in columns are aligned in rows. Current-supply lines are aligned in rows. In addition, a plurality of gate-signal lines extending in rows is aligned in columns in the pixel portion 6511. Additionally, a plurality of circuits including light-emitting elements is aligned in the pixel portion 6511.

Figure 8:
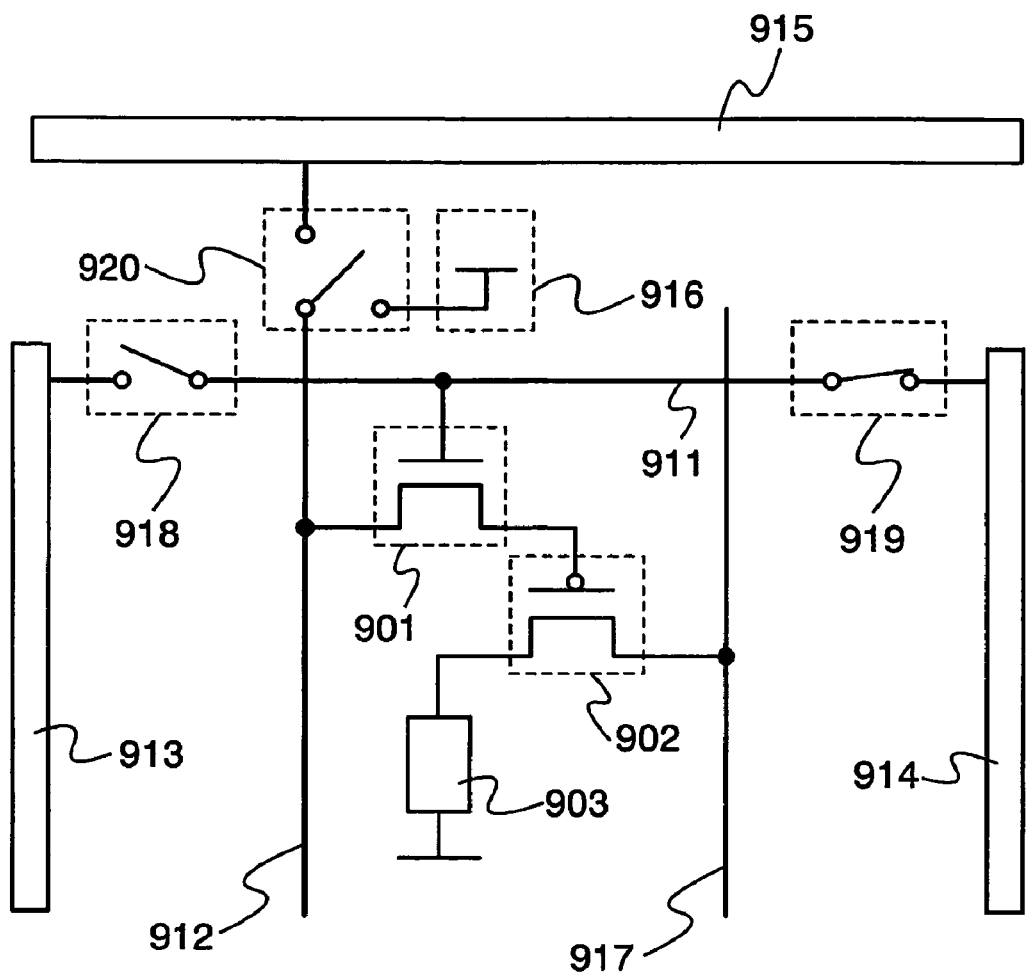
FIG. 8 is a diagram explaining one example of a circuit for driving a pixel provided for a light-emitting device according to the present invention.

FIG. 8 is a diagram showing a circuit for activating one pixel. The circuit as shown in FIG. 8 includes a first transistor 901, a second transistor 902, and a light-emitting element 903.

Each of the first and second transistors 901 and 902 is a three-terminal element including a gate electrode, a drain region, and a source region. A channel region is provided between the drain region and the source region. The region serving as the source region and the region serving as the drain region are changed depending on a configuration of a transistor, an operational condition, or the like; therefore, it is difficult to determine which regions serve as the source region and the drain region. Accordingly, the regions serving as the source and the drain are denoted as a first electrode and a second electrode in this embodiment mode, respectively.

A gate-signal line 911 and a writing gate-signal line driver circuit 913 are provided to be electrically connected or disconnected to each other by a switch 918. The gate-signal line 911 and an erasing gate-signal line driver circuit 914 are provided to be electrically connected or disconnected to each other by a switch 919. A source-signal line 912 is provided to be electrically connected to either a source-signal line driver circuit 915 or a power source 916 by a switch 920. A gate of the first transistor 901 is electrically connected to the gate-signal line 911. The first electrode of the first transistor is electrically connected to the source-signal line 912, while the second electrode thereof is electrically connected to a gate electrode of the second transistor 902. The first electrode of the second transistor 902 is electrically connected to a current-supply line 917, while the second electrode thereof is electrically connected to one electrode included in a light-emitting element 903. Note that the switch 918 may be included in the writing gate-signal line driver circuit 913. The switch 919 may also be included in the erasing gate-signal line driver circuit 914. In addition, the switch 920 may also be included in the source-signal line driver circuit 915.

Figure 9:
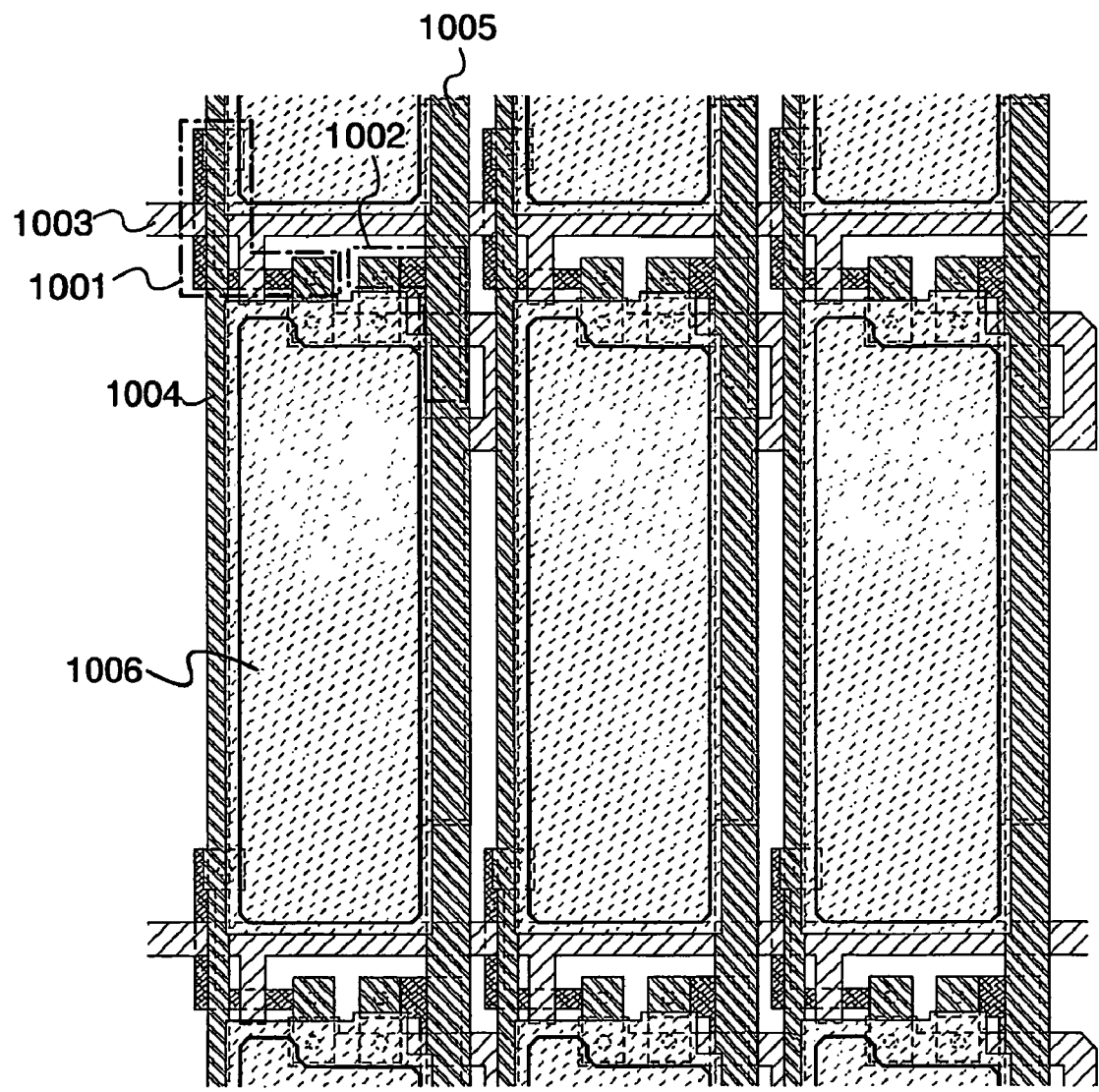
FIG. 9 is a view explaining one example of a pixel portion included in a light-emitting device according to the present invention.

The arrangement of the transistors, the light-emitting element, or the like in the pixel portion is not particularly limited. For example, the arrangement as shown in a top view of FIG. 9 can be employed. In FIG. 9, a first electrode of a first transistor 1001 is connected to a source-signal line 1004, while a second electrode of the first transistor is connected to a gate electrode of a second transistor 1002. A first electrode of the second transistor is connected to a current-supply line 1005 and a second electrode of the second transistor is connected to an electrode 1006 of a light-emitting element. Part of the gate-signal line 1003 functions as a gate electrode of the first transistor 1001.

Figure 10:
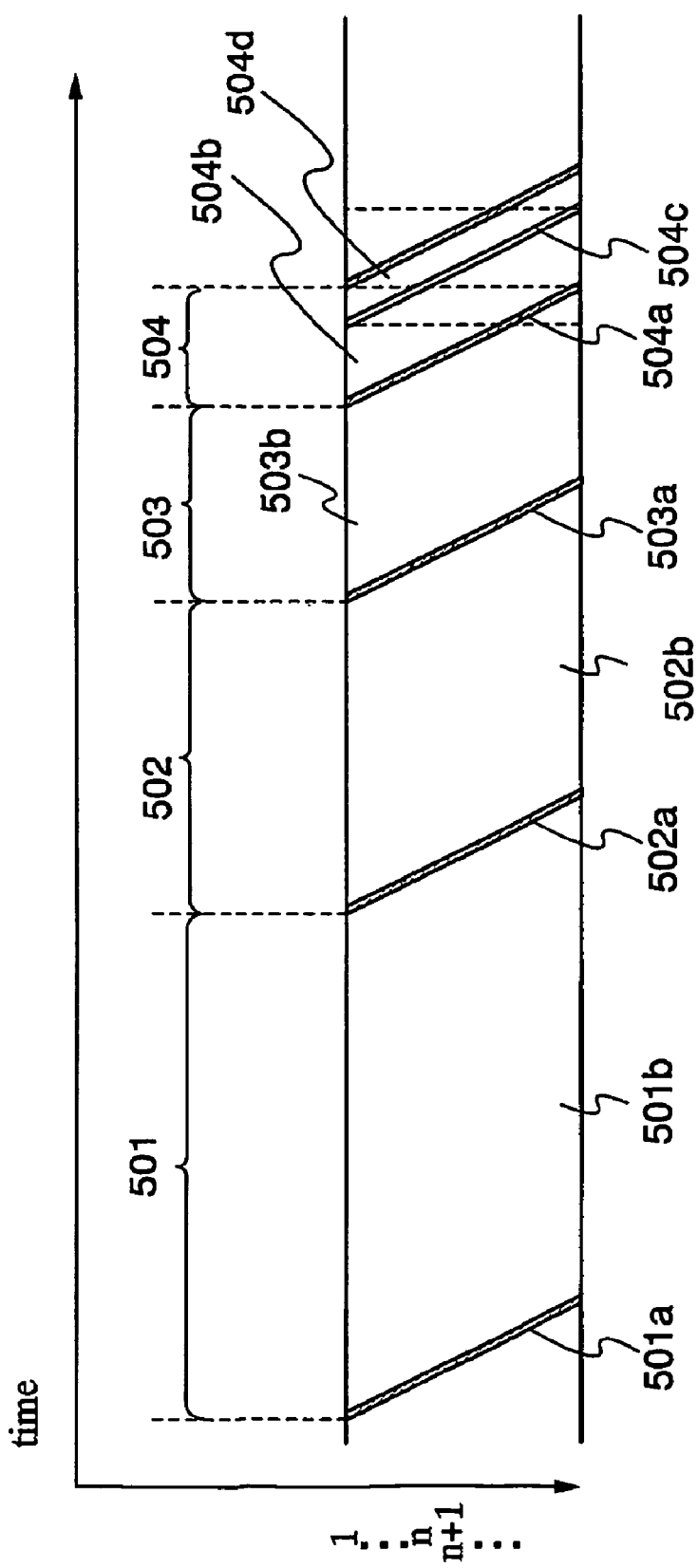
FIG. 10 is a diagram explaining a driving method for driving a pixel included in a light-emitting device according to the present invention.

Next, the driving method will be explained. FIG. 10 is a diagram explaining an operation of a frame with time. In FIG. 10, a horizontal axis indicates time passage, while a vertical axis indicates the number of scanning stages of a gate-signal line.

When an image is displayed on a light-emitting device of the present invention, a rewriting operation and a displaying operation are performed repeatedly. The number of rewriting operations is not particularly limited. However, the rewriting operation is preferably performed about 60 times a second such that a person who watches a displayed image does not detect flicker in the image. A period of operating the rewriting operation and the displaying operation of one image (one frame) is, herein, referred to as one frame period.

As shown in FIG. 10, one frame is divided into four sub-frames 501, 502, 503 and 504 including writing periods 501a, 502a, 503a and 504a and holding periods 501b, 502b, 503b and 504b. The light-emitting element applied with a signal for emitting light emits light during the holding periods. The length ratio of the holding periods in each of the first sub-frame 501, the second sub-frame 502, the third sub-frame 503 and the fourth sub-frame 504 satisfies $2^3:2^2:2^1:2^0=8:4:2:1$. This allows the light-emitting device to exhibit 4-bit gray scale. However, the number of bits and the number of gray scales are not limited to those as shown in this embodiment mode. For example, one frame may be divided into eight sub-frames so as to achieve 8-bit gray scale.

The operation in one frame will be explained. In the sub-frame 501, the writing operation is first performed in $1^{st}$ row to a last row, sequentially. Therefore, the starting time of the writing periods is varied for each row. The holding period 501b sequentially starts in the rows in which the writing period 501a has been terminated. In the holding period 501b, a light-emitting element applied with a signal for emitting light remains in a light-emitting state. Upon terminating the holding period 501b, the sub-frame 501 is changed to the next sub-frame 502 sequentially in the rows. In the sub-frame 502, a writing operation is sequentially performed in the $1^{st}$ row to the last row in the same manner as the sub-frame 501. The above operations are performed repeatedly up to the holding period 504b and then terminated. After terminating the operation in the sub-frame 504, an operation in the next frame is started. Accordingly, the sum of the light-emitting time in respective sub-frames corresponds to the emission time of each light-emitting element in one frame. By changing the emission time for each light-emitting element and combining such the light-emitting elements variously within one pixel, various display colors with different brightness and different chromaticity can be formed.

When the holding period is intended to be forcibly terminated in the row in which the writing period has already been terminated and the holding period has started prior to terminating the writing operation up to the last row as shown in the sub-frame 504, an erasing period 504c is preferably provided after the holding period 504b so as to stop light emission forcibly. The row where light emission is forcibly stopped does not emit light for a certain period (this period is referred to as a non light-emitting period 504d). Upon terminating the writing period in the last row, a writing period of a next sub-frame (or a next frame) starts sequentially from a first row. This can prevent the writing period in the sub-frame 504 from overlapping with the writing period in the next sub-frame.

Although the sub-frames 501 to 504 are arranged in order of increasing the length of the holding period in this embodiment mode, they are not necessary to be arranged in this order. For example, the sub-frames may be arranged in ascending order of the length of the holding period. Alternatively, the sub-frames may be arranged in random order. In addition, these sub-frames may further be divided into a plurality of frames. That is, scanning of gate-signal lines may be performed at several times during a period of supplying same video signals.

The operations in the writing period and the erasing period of the circuits as shown in FIG. 8 will be explained.

First, the operation in the writing period will be explained. In the writing period, the gate-signal line 911 in the $n^{th}$ row (n is a natural number) is electrically connected to the writing gate-signal line driver circuit 913 via the switch 918. The gate-signal line 911 in the $n^{th}$ row is not connected to the erasing gate-signal line driver circuit 914. The source-signal line 912 is electrically connected to the source-signal line driver circuit 915 via the switch 920. In this case, a signal is inputted in a gate of the first transistor 901 connected to the gate-signal line 911 in the $n^{th}$ row (n is a natural number), thereby turning the first transistor 901 on. At this moment, video signals are simultaneously inputted in the source signal lines in the first to last columns. Note that the video signals inputted from the source-signal line 912 in each column are independent from one another. The video signals inputted from the source-signal line 912 are inputted in a gate electrode of the second transistor 902 via the first transistor 901 connected to the respective source-signal lines. At this moment, a value of a current supplied to flow through the light-emitting element 903 from the current-supply line 917 is determined by signals imputed in the second transistor 902. Then, it is decided whether the light-emitting element 903 emits light or emits no light depending on the current value.

For example, when the second transistor 902 is a P-channel transistor, the light-emitting element 903 emits light by inputting a Low Level signal in the gate electrode of the second transistor 902. On the other hand, when the second transistor 902 is an N-channel transistor, the light-emitting element 903 emits light by inputting a High Level signal in the gate electrode of the second transistor 902.

Next, the operation in the erasing period will be explained. In the erasing period, the gate-signal line 911 in the $n^{th}$ row (n is a natural number) is electrically connected to the erasing gate-signal line driver circuit 914 via the switch 919. The gate-signal line 911 in the $n^{th}$ row is not connected to the writing gate-signal line driver circuit 913. The source-signal line 912 is electrically connected to the power source 916 via the switch 920. In this case, upon inputting a signal in the gate of the first transistor 901 connected to the gate-signal line 911 in the $n^{th}$ row, the first transistor 901 is turned on. At, this moment, erasing signals are simultaneously inputted in the source-signal lines in the first to last columns. The erasing signals inputted from the source signal line 912 are inputted in the gate electrode of the second transistor 902 via the first transistor 901 connected to the respective source-signal lines. A supply of current flowing through the light-emitting element 903 from the current-supply line 917 is forcibly stopped by the signals inputted in the second transistor 902. This makes the light-emitting element 903 emit no light forcibly. For example, when the second transistor 902 is a P-channel type, the light-emitting element 903 emits no light by inputting a High Level signal in the gate electrode of the second transistor 902. On the other hand, when the second transistor 902 is an N-channel type, the light-emitting element 903 emits no light by inputting a Low Level signal in the gate electrode of the second transistor 902.

Note that, in the erasing period, a signal for erasing is inputted in the $n^{th}$ row (n is a natural number) by the above operation. However, as mentioned above, the $n^{th}$ row sometimes remains in the erasing period while the other rows (for example, an $m^{th}$ row (m is a natural number) remains in the writing period. In such a case, since a signal for erasing is necessary to be inputted in the $n^{th}$ and a signal for writing is necessary to be inputted in the $m^{th}$ row by utilizing the source-signal lines in the same columns, the following operation is preferably performed.

After the light-emitting element 903 in the $n^{th}$ row becomes a non light-emitting state by the above operation in the erasing period, the gate-signal line 911 and the erasing gate-signal line driver circuit 914 are immediately disconnected to each other and the source-signal line 912 is connected to the source-signal line driver circuit 915 by turning the switch 920. The gate-signal line 911 and the writing gate-signal line driver circuit 913 are connected to each other while the source-signal line and the source-signal line driver circuit 915 are connected to each other. A signal is selectively inputted in the signal line in the $m^{th}$ row from the writing gate-signal line driver circuit 913 and the first transistor is turned on while signals for writing are inputted in the source-signal lines in the first to last columns from the source-signal line driver circuit 915. By inputting these signals, the light-emitting element in the $m^{th}$ row emits light or no light.

After terminating the writing period in the $m^{th}$ row as mentioned above, the erasing period immediately starts in the $n+1^{st}$ row. Therefore, the gate-signal line 911 and the writing gate-signal line driver circuit 913 are disconnected to each other and the source-signal line is connected to the power source 916 by turning the switch 920. In addition, the gate-signal line 911 and the writing gate-signal line driver circuit 913 are also disconnected to each other and the gate-signal line 911 is also connected to the erasing gate-signal line driver circuit 914. A signal is selectively inputted in the gate-signal line in the $n+1^{st}$ row from the erasing gate-signal line driver circuit 914 to input the signal in the first transistor while an erasing signal is inputted therein from the power source 916. Upon terminating the erasing period in the $n+1^{st}$ row in this manner, the writing period immediately starts in the $m+1^{st}$ row. In the same manner, it is only necessary that the erasing period and the writing period are repeated until the erasing period of the last row.

Although the writing period of the $m^{th}$ row is provided between the erasing period of the $n^{th}$ row and the erasing period of the $n+1^{st}$ row in this embodiment mode, the present invention is not limited thereto. The writing period of the $m^{th}$ row may be provided between the erasing period in the $x-1^{st}$ row and the erasing period in the $n^{th}$ row.

In this embodiment mode, when the non light-emitting period 504d is provided like the sub-frame 504, the operation of disconnecting the erasing gate-signal line driver circuit 914 from one gate-signal line and connecting the writing gate-signal line driver circuit 913 to the other gate-signal line is performed repeatedly. This operation may be performed in a frame in which a non light-emitting period is not particularly provided.

Embodiment Mode 4

An example of a cross-sectional view of a light-emitting device including a light-emitting element of the present invention will be explained with reference to FIGS. 11A to 11C.

In each of FIGS. 11A to 11C, a region surrounded by a dotted line represents a transistor 11 that is provided for driving a light-emitting element 12 of the present invention. The light-emitting element 12 of the present invention includes a layer 15 where a hole-generating layer, an electron-generating layer, and a layer containing a light-emitting substance are stacked between a first electrode 13 and a second electrode 14. A drain of the transistor 11 and the first electrode 13 are electrically connected to each other by a wiring 17 that penetrates a first interlayer insulating film 16 (16a, 16b and 16c). The light-emitting element 12 is isolated from another light-emitting elements provided adjacent to the light-emitting element 12 by a partition wall layer 18. A light-emitting device of the present invention having such a structure is provided over a substrate 10 in this embodiment mode.

Note that the transistor 11 shown in each of FIGS. 11A to 11C is a top-gate transistor in which a gate electrode is provided on a side of a semiconductor layer opposite to the substrate. However, the structure of the transistor 11 is not particularly limited. For example, a bottom-gate transistor may be employed. In the case of using a bottom-gate transistor, either a transistor in which a protection film is formed over a semiconductor layer of a channel (a channel protection transistor) or a transistor in which part of a semiconductor layer of a channel is etched in a concave (a channel etched transistor) may be used.

The semiconductor layer included in the transistor 11 may be any of a crystalline semiconductor, an amorphous semiconductor, a semi-amorphous semiconductor, and the like.

Note that a semi-amorphous semiconductor has an intermediate structure between an amorphous structure and a crystalline structure (including a single crystalline structure and a polycrystalline structure), and a third condition that is stable in term of free energy. The semi-amorphous semiconductor further includes a crystalline region having a short-range order along with lattice distortion. A crystal grain with a size of 0.5 nm to 20 nm is included at least in a part of a semi-amorphous semiconductor film. Raman spectrum is shifted to a lower wavenumber side less than 520 cm$^{-1}$. The diffraction peaks of (111) and (220), which are believed to be derived from silicon crystal lattice, are observed in the semi-amorphous semiconductor by the X-ray diffraction. The semi-amorphous semiconductor contains hydrogen or halogen of at least 1 atomic % or more for terminating dangling bonds. The semi-amorphous semiconductor is also referred to as a so-called microcrystalline semiconductor. The semi-amorphous semiconductor is formed by glow discharge decomposition with silicide gas (plasma CVD). As for the silicide gas, $SiH_4$, and besides, $Si_2H_6$, $SiH_2Cl_2$, $SiHCl_3$, $SiCl_4$, $SiF_4$, and the like can be used. The silicide gas may also be diluted with $H_2$, or a mixture of $H_2$ and one or more of rare gas elements of He, Ar, Kr, and Ne. The dilution ratio is set to be in the range of 1:2 to 1:1,000. The pressure is set to be approximately in the range of 0.1 Pa to 133 Pa. The power frequency is set to be 1 MHz to 120 MHz, preferably, 13 MHz to 60 MHz. The substrate heating temperature may be set to be 300° C. or less, more preferably, 100° C. to 250° C. As for impurity elements contained in the film, each concentration of impurities for atmospheric constituents such as oxygen, nitrogen and carbon is preferably set to be $1 \times 10^{20}/cm^3$ or less. In particular, the oxygen concentration is set to be $5 \times 10^{19}/cm^3$ or less, preferably, $1 \times 10^{19}/cm^3$ or less. Further, the mobility of a TFT (thin film transistor) using a semi-amorphous semiconductor is set to be approximately 1 to 10 m$^2$/Vsec.

As a specific example of a crystalline semiconductor layer, a semiconductor layer made from single crystal silicon, polycrystalline silicon, silicon germanium, or the like can be given. These materials may be formed by laser crystallization. For example, these materials may be formed by crystallization with the use of the solid phase growth method using nickel or the like.

When a semiconductor layer is made from an amorphous substance, for example, amorphous silicon, it is preferable to use a light-emitting device having circuits including only N-channel transistors as the transistor 11 and the other transistor (a transistor included in a circuit for driving a light-emitting element). Alternatively, a light-emitting device having circuits including either N-channel transistors or P-channel transistors may be employed. Also, a light-emitting device having circuits including both an N-channel transistor and a P-channel transistor may be used.

The first interlayer insulating film 16 may be a multilayer as shown in FIGS. 11A and 11C or a single layer. The interlayer insulating film 16a is made from an inorganic material such as silicon oxide or silicon nitride. The interlayer insulating film 16b is made from a substance with self-planarizing properties such as acrylic, siloxane, or silicon oxide that can be formed by being coated. Note that siloxane has a framework structure formed by the bond between silicon (Si) and oxygen (O), in which an organic group (for example, an alkyl group or an aromatic hydrocarbon group) including at least hydrogen is used as a substituent. As a substituent, a fluoro group may also be used, or an organic group including at least hydrogen and a fluoro group may also be used. The interlayer insulating film 16c is made from a silicon nitride film containing argon (Ar). The substances constituting the respective layers are not particularly limited thereto. Therefore, substances other than the above substances may be employed. Alternatively, the above substances may be combined with each other. Accordingly, the first interlayer insulating film 16 may be formed using both an inorganic material and an organic material or by using any one of an inorganic material and an organic material.

The edge portion of the partition wall layer 18 preferably has a shape in which the radius of curvature is continuously varied. This partition wall layer 18 is formed using acrylic, siloxane, resist, silicon oxide, or the like. Note that the partition wall layer 18 may be made from any one of or both an inorganic material and an organic material.

Each of FIGS. 11A and 11C shows a structure in which only the first interlayer insulating film 16 is sandwiched between the transistor 11 and the light-emitting element 12. Alternatively, as shown in FIG. 11B, a second interlayer insulting film 19 (19a and 19b) as well as the first interlayer insulating film 16 (16a and 16b) may be provided. In the light-emitting device as shown in FIG. 11B, the first electrode 13 penetrates the second interlayer insulating film 19 to be electrically connected to the wiring 17.

The second interlayer insulating film 19 may be a multilayer or a single layer as well as the first interlayer insulating film 16. The interlayer insulating film 19b is made from a substance with self-planarizing properties such as acrylic, siloxane, or silicon oxide that can be formed by being coated. Note that siloxane has a framework structure formed by the bond between silicon (Si) and oxygen (O), in which an organic group (for example, an alkyl group or an aromatic hydrocarbon group) including at least hydrogen is used as a substituent. As a substituent, a fluoro group may also be used, or an organic group including at least hydrogen and a fluoro group may also be used. The interlayer insulating film 19b is made from a silicon nitride film containing argon (Ar). The substances constituting the respective layers are not particularly limited thereto. Therefore, substances other than the above substances may be employed. Alternatively, the above substances may be combined with each other. Accordingly, the second interlayer insulating film 19 may be formed using both an inorganic material and an organic material or using any one of an inorganic material and an organic material.

When the first electrode and the second electrode are both formed using a light-transmitting substance in the light-emitting element 12, light generated in the light-emitting element can be extracted from both the first electrode 13 and the second electrode 14 as shown in outline arrows in FIG. 11A. When only the second electrode 14 is made from a light-transmitting substance, light generated in the light-emitting element can be extracted only from the second electrode 14 as shown in an outline arrow in FIG. 11B. In this case, the first electrode 13 is preferably made from a material with high reflectance or a film (reflection film) made from a material with high reflectance is preferably provided under the first electrode 13. When only the first electrode 13 is made from a light-transmitting substance, light generated in the light-emitting element can be extracted only from the first electrode 13 as shown in an outline arrow in FIG. 11C. In this case, the second electrode 14 is preferably made from a material with high reflectance or a reflection film is preferably provided above the second electrode 14.

In addition, in the light-emitting element 12, the layer 15 may be stacked so as to be operated when a voltage is applied so that the potential of the second electrode 14 gets higher than the potential of the first electrode 13. Alternatively, in the light-emitting element 12, the layer 15 may be stacked so as to be operated when a voltage is applied so that the potential of the second electrode 14 gets lower than the potential of the first electrode 13. In the former case, the transistor 11 is an N-channel transistor, whereas in the latter case, the transistor 11 is a P-channel transistor.

Figure 12:
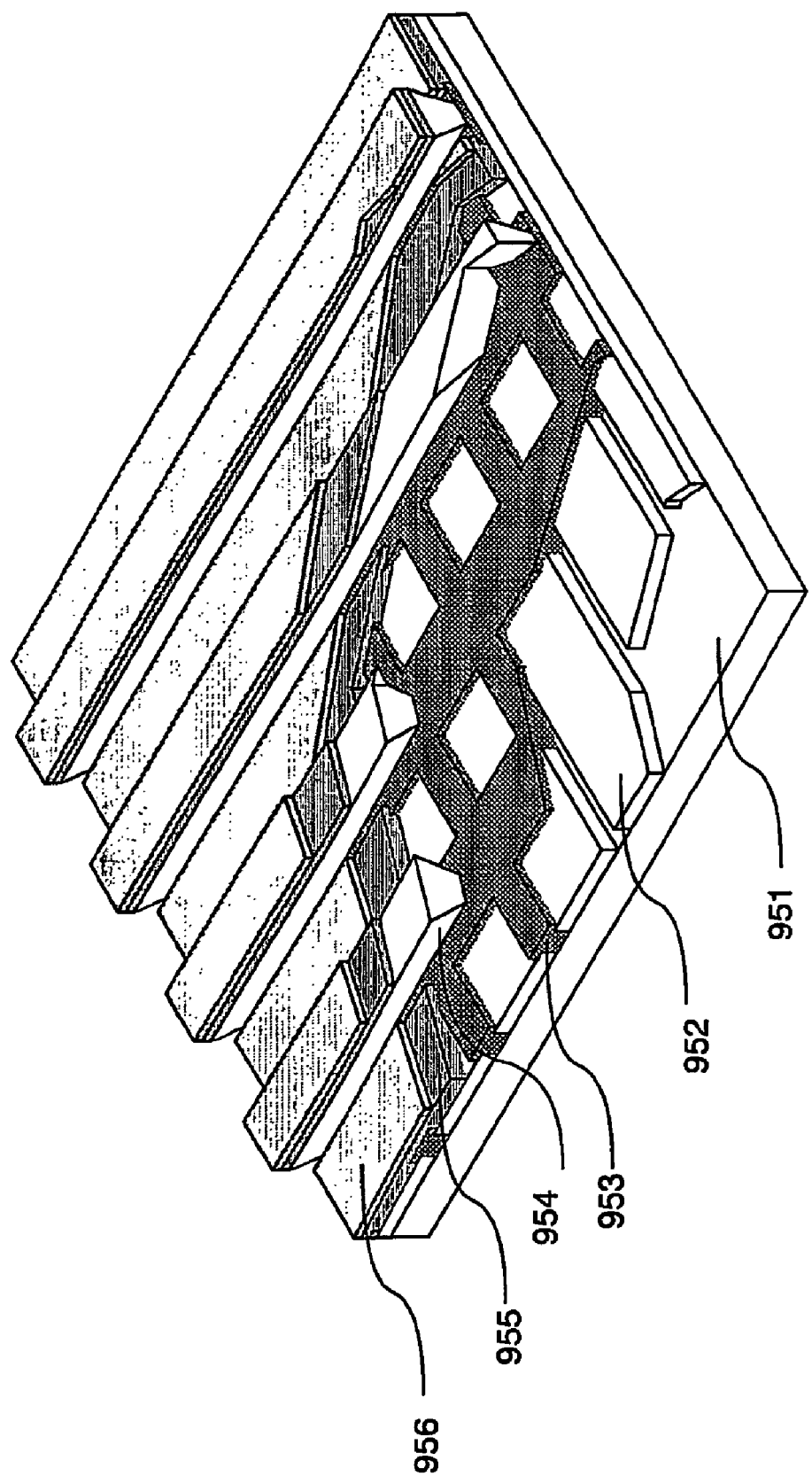
FIG. 12 is a view explaining one example of a light-emitting device according to the present invention.

As set forth above, this embodiment mode explains an active light-emitting device that controls driving of a light-emitting element by a transistor; however, a passive light-emitting device that drives a light-emitting element without particularly providing a driving element such as a transistor may be employed as well. FIG. 12 shows a perspective view of a passive light-emitting device which is manufactured applying the present invention. In FIG. 12, a layer 955 where a layer containing a light-emitting substance, an electron-generating layer, and a hole-generating layer are sequentially stacked is provided between an electrode 952 and an electrode 956 over a substrate 951. The end of the electrode 952 is covered with an insulating layer 953. A partition wall layer 954 is provided over the insulating layer 953. The nearer the sidewall of the partition wall layer is to a substrate surface, the narrower the distance between one sidewall and the other sidewall is to have inclination. In other words, a cross section of the partition wall layer 954 in a minor axis is a trapezoid, in which the lower base (a base in the same direction as the face direction of the insulating layer 953 and in contact with the insulating layer 953) is shorter than the upper base (a base in the same direction as the face of the insulating layer 953 and not in contact with the insulating layer 953). Accordingly, defectiveness of a light-emitting element due to static electricity or the like can be prevented by providing the partition wall layer 954. In addition, a passive light-emitting device can also be driven with low power consumption by including a light-emitting element of the present invention that is operated with a low drive voltage.

Embodiment Mode 5

In a light-emitting device using a light-emitting element of the present invention as a pixel, display operation is performed preferably with few display defects due to malfunction of a light-emitting element. Therefore, an electronic device with little display image misidentification due to a display defect can be obtained by applying such a light-emitting device to a display portion. In addition, a light-emitting device using a light-emitting element of the present invention as a light source is capable of lighting preferably with few defects due to malfunction of a light-emitting element. Therefore, in this manner, a light-emitting device of the present invention is mounted by using such a light-emitting device as a lighting portion such as a backlight; thus, such malfunction that a dark portion is formed locally due to a defect of a light-emitting element is reduced and an image can be displayed preferably.

Figure 13A:
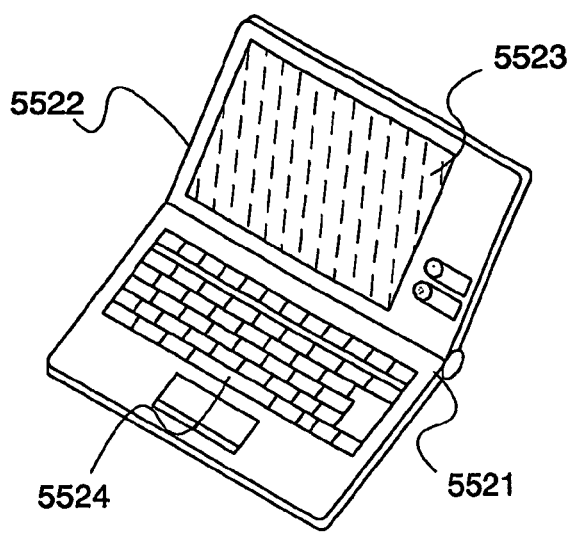
FIGS. 13A to 13C are views each explaining one example of an electronic device manufactured by applying the present invention.
Figure 13B:
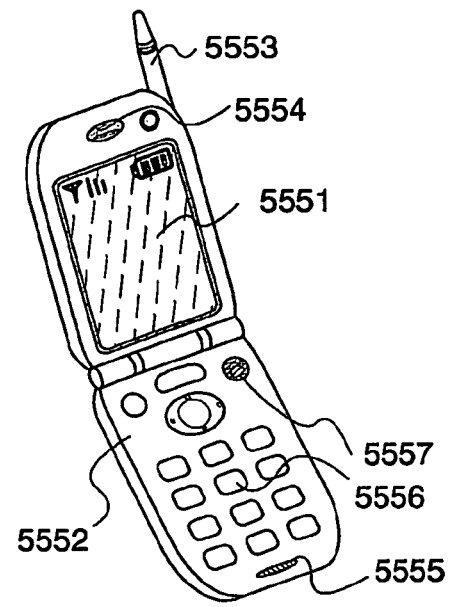
Figure 13C:
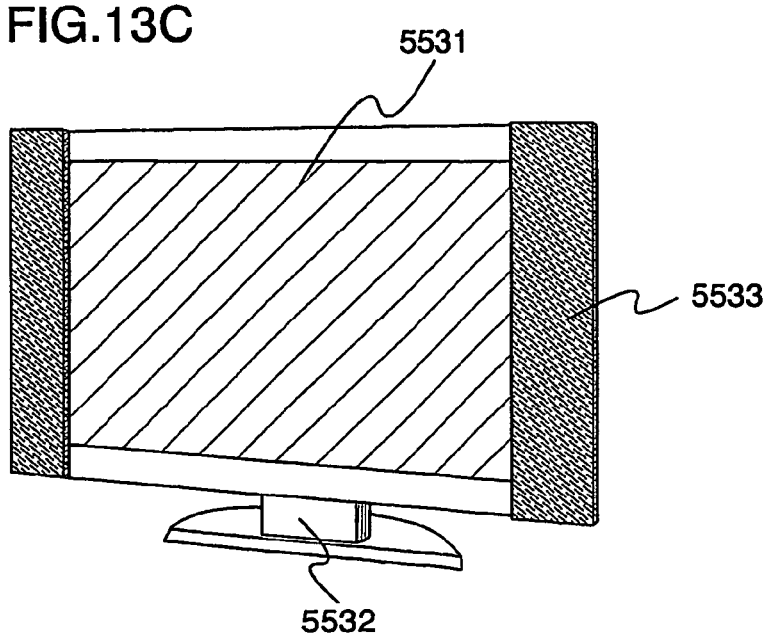

Each of FIGS. 13A to 13C shows one example of an electronic device mounted with a light-emitting device to which the present invention is applied.

Figure 14:
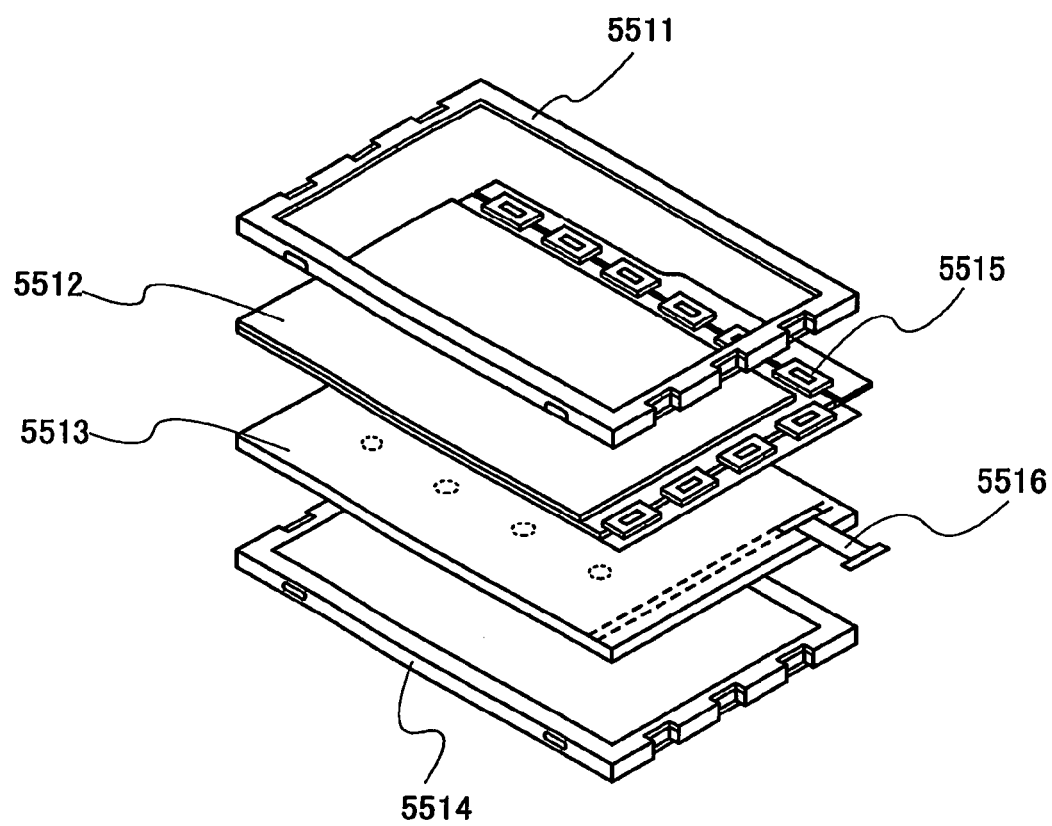
FIG. 14 is a view explaining a lighting system manufactured by applying the present invention.

FIG. 13A is a personal computer manufactured applying the present invention, which includes a main body 5521, a housing 5522, a display portion 5523, a keyboard 5524, and the like. The personal computer can be achieved by incorporating the light-emitting device using a light-emitting element of the present invention therein as a pixel as shown in FIG. 7. The personal computer can also be achieved by incorporating the light-emitting device using a light-emitting element of the present invention therein as a light source. Specifically, as shown in FIG. 14, it is only necessary to incorporate, as the display portion, a lighting system where a liquid crystal device 5512 and a light-emitting device 5513 are framed between housings 5511 and 5514 in the personal computer. Note that, in FIG. 14, an external input terminal 5515 is attached to the liquid crystal device 5512 and an external input terminal 5516 is attached to the light-emitting device 5513.

FIG. 13B is a telephone set manufactured applying the present invention, which includes a main body 5552, a display portion 5551, an audio output portion 5554, an audio input portion 5555, operation switches 5556 and 5557, an antenna 5553, and the like. The telephone set can be achieved by incorporating a light-emitting device having a light-emitting element of the present invention therein as the display portion.

FIG. 13C is a television device manufactured applying the present invention, which includes a display portion 5531, a housing 5532, speakers 5533, and the like. The television device can be achieved by incorporating a light-emitting device having a light-emitting element of the present invention therein as the display portion.

As set forth above, a light-emitting device of the present invention is suitable to be used as the display portions of various kinds of electronic devices. Note that an electronic device is not limited to ones described in this embodiment mode and may be another electronic device such as a navigation system.

Embodiment Mode 6

An anthracene derivative used for implementing the present invention will be explained.

Anthracene derivatives represented by structural formulas (3) to (6) can be given as the anthracene derivatives used for implementing the present invention.

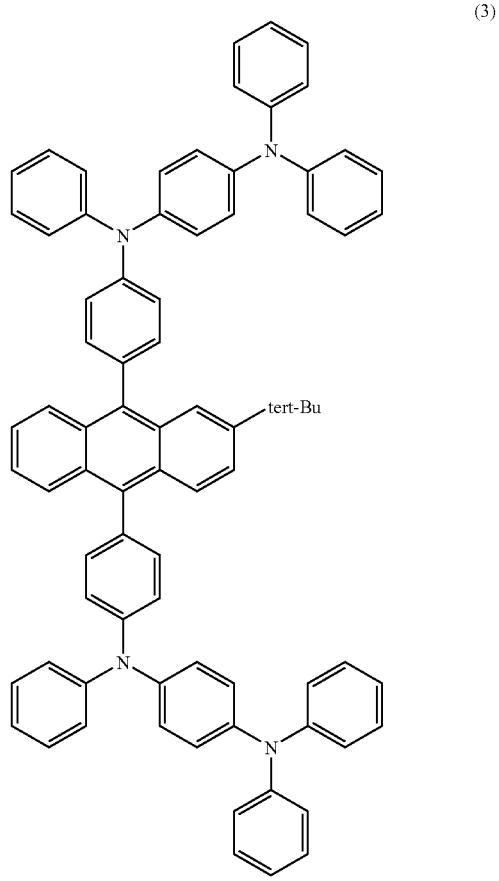

(3)

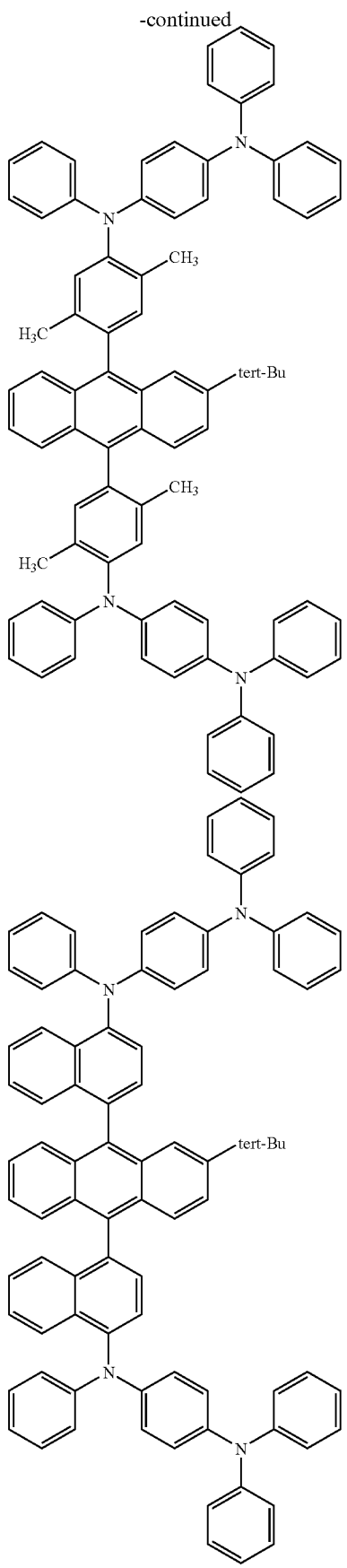
(4)
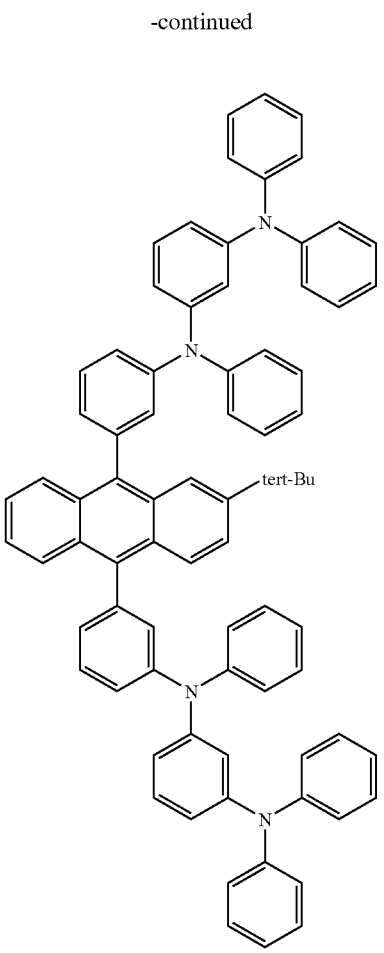
(5)
(6)
These anthracene derivatives can be synthesized according to the following synthetic scheme (a-1) or a synthetic scheme (a-2).
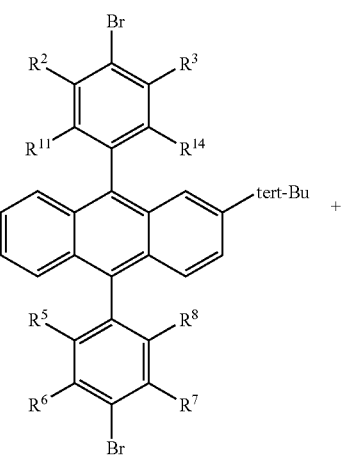
+

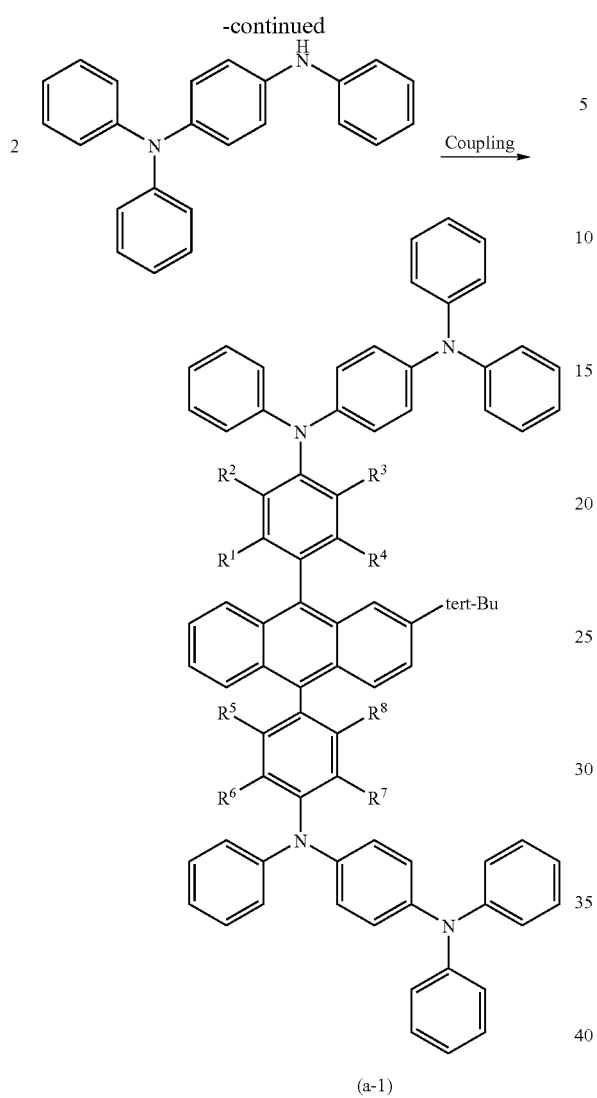

(a-1)

In the synthetic scheme (a-1), $R^1$ to $R^8$ are individually any one of hydrogen and an alkyl group having 1 to 4 carbon atoms, or $R^1$ and $R^2$, $R^3$ and $R^4$, $R^5$ and $R^6$, and $R^7$ and $R^8$ are individually bonded to from an aromatic ring. The bond of $R^1$ and $R^2$, the bond of $R^3$ and $R^4$, the bond of $R^5$ and $R^6$, and the bond of $R^7$ and $R^8$ are independent of one another.

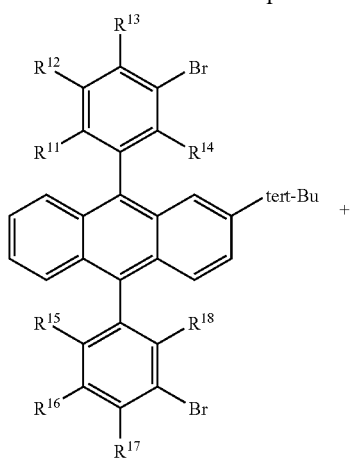

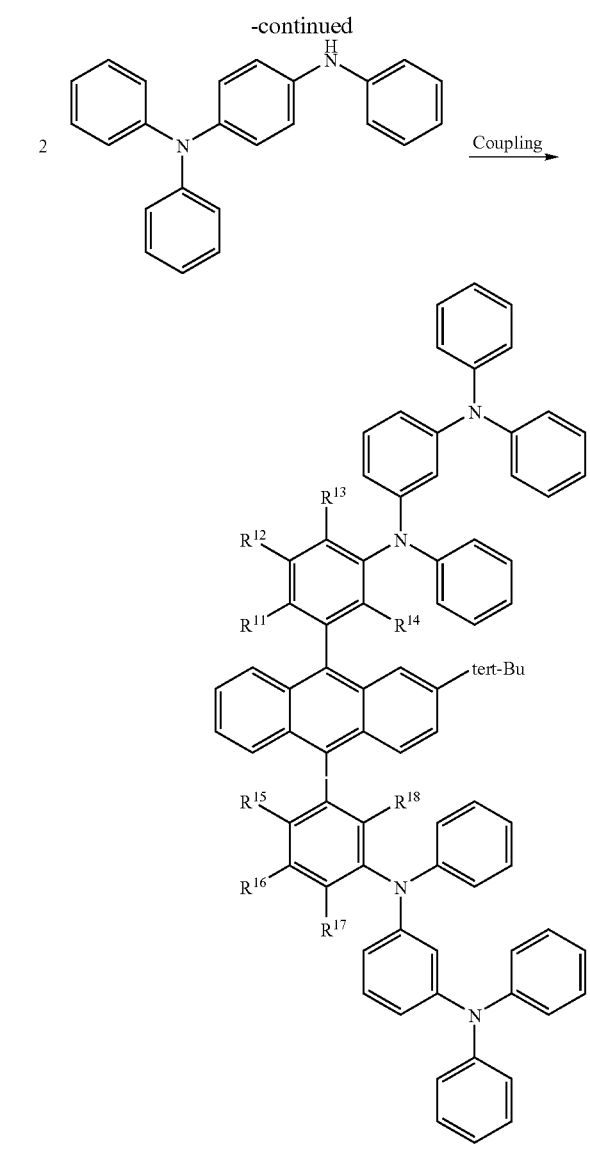

(a-2)

In the synthetic scheme (a-2), $R^{11}$ to $R^{18}$ are individually any one of hydrogen and an alkyl group having 1 to 4 carbon atoms, or $R^{11}$ and $R^{12}$, $R^{12}$ and $R^{13}$, $R^{15}$ and $R^{16}$, and $R^{16}$ and $R^{17}$ are individually bonded to from an aromatic ring. The bond of $R^{11}$ and $R^{12}$, the bond of $R^{12}$ and $R^{13}$, the bond of $R^{15}$ and $R^{16}$, and the bond of $R^{16}$ and $R^{17}$ are independent of one another.

The anthracene derivative used for implementing the present invention as explained forth has resistance to the repetition of oxidation reaction.

Embodiment 1

A method for synthesizing an anthracene derivative used for implementing the present invention and result of examining resistance to oxidation reaction will be explained.

First, a synthesis method of 9,10-bis(4-bromophenyl)-2-tert-butylanthracene will be explained.

Under a nitrogen flow, at −78° C., a 1.58 mol/L hexane solution of butyllithium (13.4 mL) was dropped in a dry ether solution (200 mL) of p-dibromobenzene (5.0 g). After completion of the dropping, stirring was performed at the same temperature (−78° C.). A dry ether solution (40 mL) of 2-t-butylanthraquinone (2.80 g) was dropped at −78° C., and then the reaction solution was slowly raised to a room temperature. After overnight stirring at a room temperature, water was added, and extraction was performed with ethyl acetate. The organic layer was washed with a saturated aqueous solution of sodium chloride, dried with magnesium sulfate, filtered, and condensed. Then, the residue was purified by silica gel chromatography (developing solvent, hexane-ethyl acetate) to obtain a compound (5.5 g).

Measurement of the obtained compound by nuclear magnetic resonance ($^1$H-NMR) could confirm that the compound was 9,10-bis(4-bromophenyl)-2-tert-butyl-9,10-dihydroxy-9,10-dihydroanthracene.

$^1$H-NMR data of this compound is shown below.

$^1$H-NMR (300 MHz, CDCl$_3$); δ=1.31 (s, 9H), 2.81 (s, 1H), 2.86 (s, 1H), 6.82-6.86 (m, 4H), 7.13-7.16 (m, 4H), 7.36-7.43 (m, 3H), 7.53-7.70 (m, 4H)

In addition, the synthetic scheme (b-1) of 9,10-bis(4-bromophenyl)-2-tert-butyl-9,10-dihydroxy-9,10-dihydroanthracene is shown below.

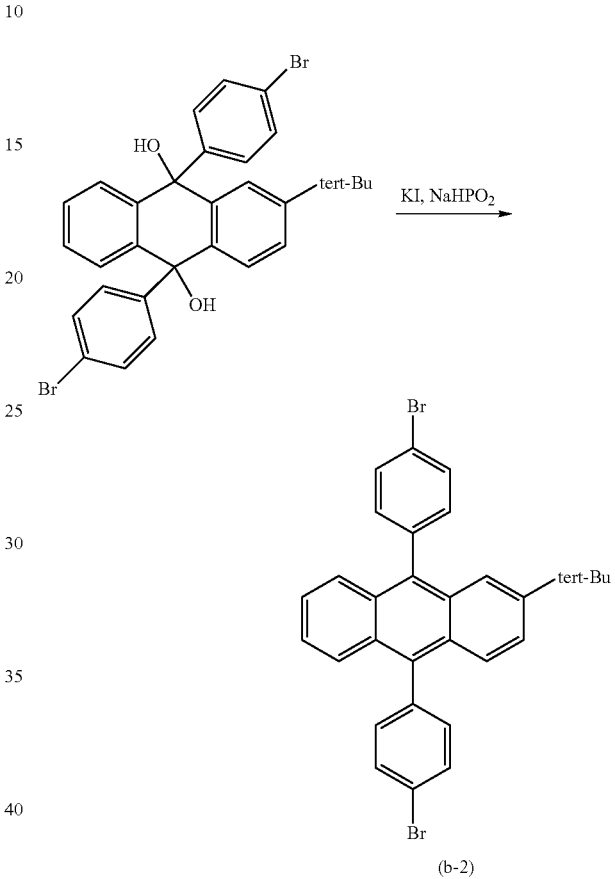

In the atmosphere, 987 mg (1.55 mmol) of the thus synthesized 9,10-bis(4-bromophenyl)-2-tert-butyl-9,10-dihydroxy-9,10-dihydroanthracene, 664 mg (4 mmol) of potassium iodide, and 1.48 g (14 mmol) of sodium phosphinate dehydrate were suspended in 14 mL of glacial acetic acid, and held at reflux for 2 hours while heating and stirring. After cooling to a room temperature, a produced precipitation was filtered, and washed with about 50 mL of methanol to obtain a filtered object. Then, the filtered object was dried to obtain a cream powdery compound (700 mg). The yield was 82%. Measurement of this compound by nuclear magnetic resonance ($^1$H-NMR and $^{13}$C-NMR) could confirm that the compound was 9,10-bis(4-bromophenyl)-2-tert-butylanthracene.

$^1$H-NMR data and $^{13}$C-NMR data of this compound is shown below.

$^1$H-NMR (300 MHz, CDCl$_3$); δ→1.28 (s, 9H), 7.25-7.37 (m, 6H), 7.44-7.48 (m, 1H) 7.56-7.65 (m, 4H), 7.71-7.76 (m, 4H)

$^{13}$C-NMR (300 MHz, CDCl$_3$); δ=30.8, 35.0, 120.8, 121.7, 121.7, 124.9, 125.0, 125.2, 126.4, 126.6, 126.6, 128.3, 129.4, 129.7, 129.9, 131.6, 131.6, 133.0, 133.0, 135.5, 135.7, 138.0, 138.1, 147.8

In addition, the synthetic scheme (b-2) of 9,10-bis(4-bromophenyl)-2-tert-butylanthracene is shown below.

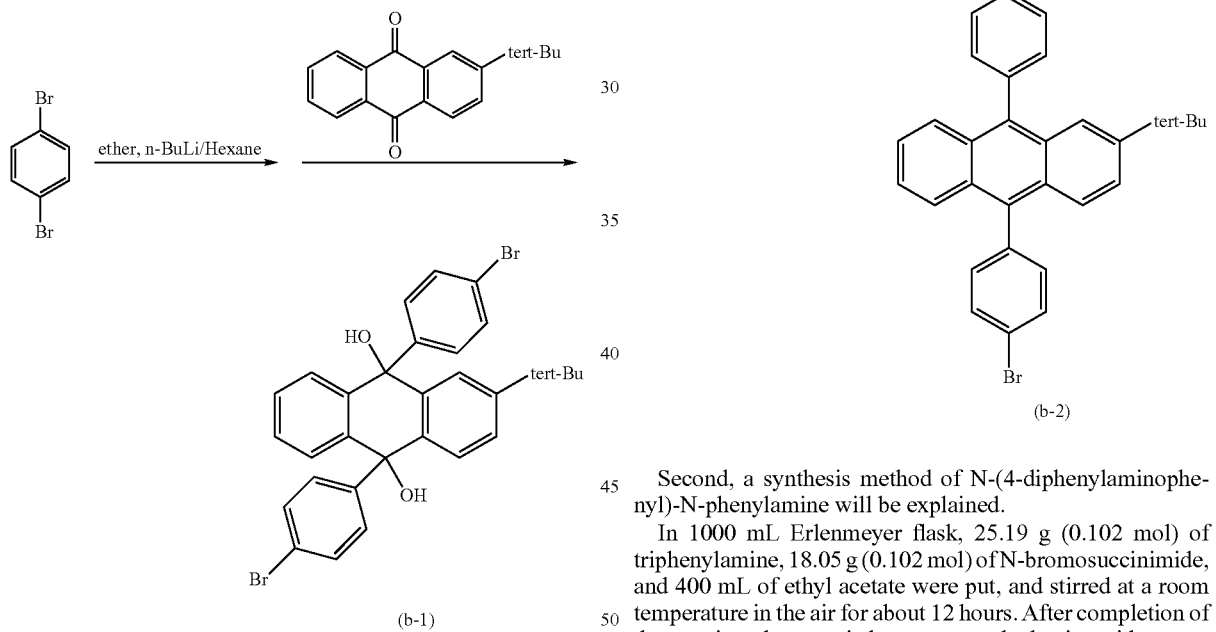

Second, a synthesis method of N-(4-diphenylaminophenyl)-N-phenylamine will be explained.

In 1000 mL Erlenmeyer flask, 25.19 g (0.102 mol) of triphenylamine, 18.05 g (0.102 mol) of N-bromosuccinimide, and 400 mL of ethyl acetate were put, and stirred at a room temperature in the air for about 12 hours. After completion of the reaction, the organic layer was washed twice with a saturated aqueous solution of sodium carbonate, then, the aqueous layer was subjected to extraction twice with ethyl acetate, and the solution subjected to extraction was washed with a saturated aqueous solution of sodium chloride together with the organic layer. After drying with magnesium sulfate, natural filtration, and condensation, the obtained colorless solid was recrystallized with ethyl acetate and hexane to obtain a colorless powdery solid (22.01 g, yield: 66%). Nuclear magnetic resonance ($^1$H-NMR) could confirm that this colorless powdery solid was 4-bromotriphenylamine. The measurement result by nuclear magnetic resonance (NMR) is shown below.

$^1$H-NMR data of this compound is shown below.

$^1$H-NMR (300 MHz, CDCl$_3$) δppm: 7.32 (d, 2H, J=8.7 Hz), 7.29-7.23 (m, 4H), 7.08-7.00 (m, 6H), 6.94 (d, 2H, J=8.7 Hz)

In addition, the synthetic scheme (c-1) of 4-bromotriphenylamine is shown below.

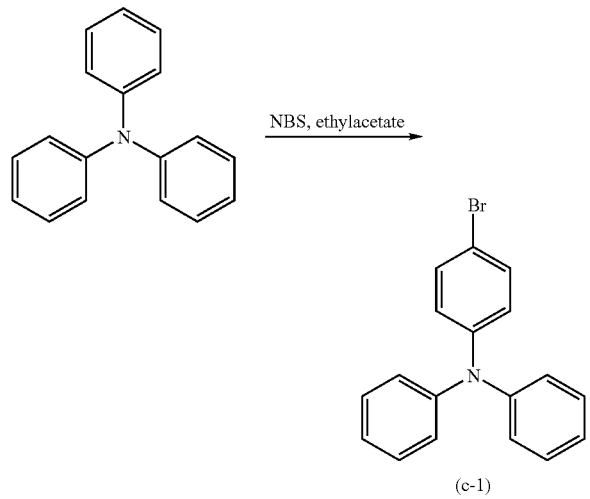

(c-1)

Next, 7.21 g (0.053 mol) of acetoanilide, 17.32 g (0.053 mol) of the synthesized 4-bromotriphenylamine, 2.05 g (0.011 mol) of copper iodide (CuI), and 22.00 g (0.103 mol) of tripotassium phosphate were put in a 500 mL three-neck flask, and the atmosphere in the flask was made a nitrogen atmosphere. Then, 150 mL of dioxane and 1.3 mL of trans-1,2-cyclohexanediamine were added, and reflux for 40 hours was performed. After completion of the reaction, the solid in the flask was removed by suction filtration after cooling to a room temperature. The filtrate was washed twice with a saturated aqueous solution of sodium carbonate, the aqueous layer was subjected to extraction twice with chloroform, and the solution subjected to extraction was washed with a saturated aqueous solution of sodium chloride together with the organic layer. After drying with magnesium sulfate, natural filtration, and condensation, the obtained white solid was purified by silica gel chromatography (ethyl acetate to hexane is 1:1) to obtain a white powdery solid (12.00 g, yield: 59%). Nuclear magnetic resonance ($^1$H-NMR) could confirm that this white powdery solid was N-(4-diphenylaminophenyl)acetoanilide.

$^1$H-NMR data of this compound is shown below.

$^1$H-NMR (300 MHz, CDCl$_3$) δppm: 7.36-7.23 (m, 9H), 7.12-7.03 (m, 10H), 2.07 (s, 3H)

In addition, the synthetic scheme (c-2) of N-(4-diphenylaminophenyl)acetoanilide is shown below.

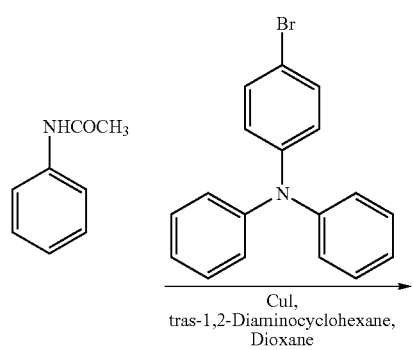

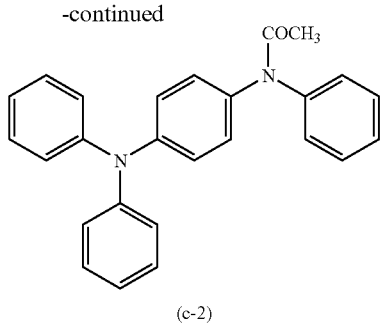

(c-2)

In a 500 mL recovery flask, 20.00 g (0.053 mol) of the synthesized N-(4-diphenylaminophenyl)acetoanilide, 100 g of a 40% sodium hydroxide solution, 50 mL of tetrahydrofuran, and 50 mL of ethanol were put, and reflux was performed for 2 hours in the air. After completion of the reaction, the sodium hydroxide solution was removed after cooling to a room temperature. The organic layer was washed twice with water, the aqueous layer was subjected to extraction twice with chloroform, and the solution subjected to extraction was washed with a saturated aqueous solution of sodium chloride together with the organic layer. After drying with magnesium sulfate, natural filtration, and condensation, the obtained colorless solid was recrystallized with ethyl acetate and hexane to obtain a colorless powdery solid (14.69 g, yield: 83%). Nuclear magnetic resonance ($^1$H-NMR) could confirm that this colorless powdery solid was N-(4-diphenylaminophenyl)-N-phenylamine.

$^1$H-NMR data of this compound is shown below.

$^1$H-NMR (300 MHz, CDCl$_3$) δppm: 7.30-7.20 (m, 5H), 7.08-6.87 (m, 14H), 5.61 (s, 1H)

In addition, the synthetic scheme (c-3) of N-(4-diphenylaminophenyl)-N-phenylamine is shown below.

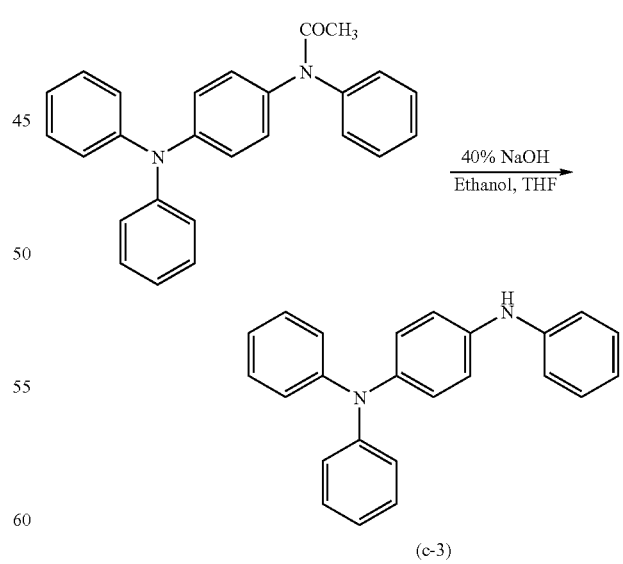

(c-3)

Third, a synthesis method of 9,10-bis {4-[N-(4-diphenylaminophenyl)-N-phenylamino]phenyl}-2-tert-butylanthracene represented by the structural formula (6) will be explained.

In a 200 mL three-neck flask, 2.00 g (0.0037 mol) of 9,10-bis(4-bromophenyl)-2-tert-butylanthracene, 2.61 g (0.0078 mol) of (4-diphenylamino)phenylaniline, 428 mg (0.77 mmol) of bisdibenzylideneacetonepalladium, and 2.00 g (0.021 mol) of tert-butoxysodium were put, and the atmosphere within the flask was made to be under a nitrogen flow. After that, 20 mL of dehydrated toluene and 4.0 mL of a 10% hexane solution of tri-t-butylphosphine were added, and stirring was performed at 80° C. for 8 hours. After completion of the reaction, the reaction solution was cooled to a room temperature and the reaction solution was washed twice with water, then, the aqueous layer was subjected to extraction twice with chloroform, and the solution subjected to extraction was washed with a saturated aqueous solution of sodium chloride together with the organic layer and then dried with magnesium sulfate. After natural filtration and condensation, the obtained brown oily object was purified by silica gel chromatography (hexane to ethyl acetate is 9:1) and then recrystallized with ethyl acetate and hexane to obtain a yellow powdery solid (1.14 g, yield: 29%, refer to a synthetic scheme (d-1)). Nuclear magnetic resonance ($^1$H-NMR) could confirm that this yellow powdery solid was 9,10-bis{[N-(4-diphenylaminophenyl)-N-phenylamino]phenyl}-2-tert-butyl anthracene (abbreviation: DPABPA).

$^1$H-NMR data of this compound is shown below.

$^1$H-NMR (300 MHz, CDCl$_3$) δppm: 7.89-7.81 (m, 2H), 7.78 (d, 1H, J=9.3 Hz), 7.66 (d, 2H, J=1.8 Hz), 7.48 (d, d, 1H, J=9.3 Hz), 7.38-7.24 (m, 25H), 7.17-7.13 (m, 12H), 7.08-6.98 (m, 10H), 1.30 (s, 9H)

In addition, the synthetic scheme (d-1) of DPABPA is shown below.

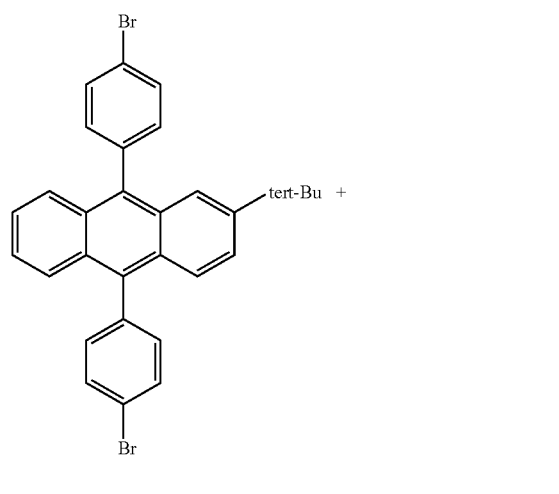

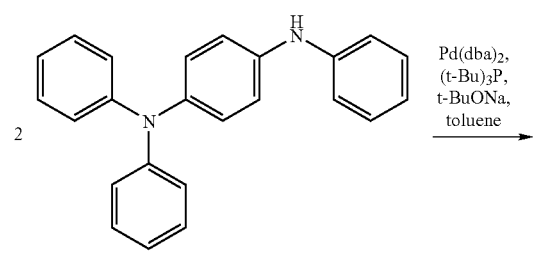

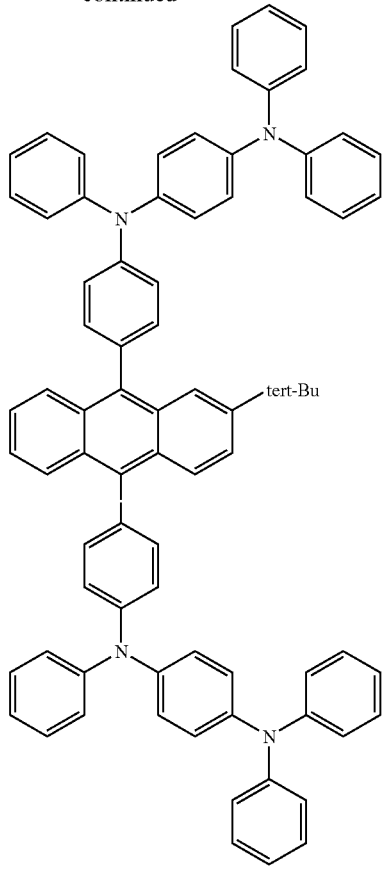

(d-1)

Next, the stability of DPABPA with respect to oxidation was examined by cyclic voltammetry (CV). Note that an electrochemical analyzer (ALS, Model 600A) from BAS was used for the measurement.

In the CV measurement, tetra-n-butylammonium (n-Bu$_4$NClO$_4$) and dimethylformamide (DMF) were used as a supporting electrolyte and a solvent, respectively. In addition, a Pt electrode, a Pt electrode, and an Ag/Ag$^+$ electrode were used as a work electrode, an auxiliary electrode, and a reference electrode, respectively. The scan rate in the CV measurement is controlled to be 0.025 V/s, and a series of operations as one cycle, scanning for changing the potential of the work electrode with respect to the Ag/Ag$^+$ from 0 to 0.4 V and scanning for returning the potential from 0.4 to 0 V, was performed repeatedly to complete 500 cycles.

Figure 15:
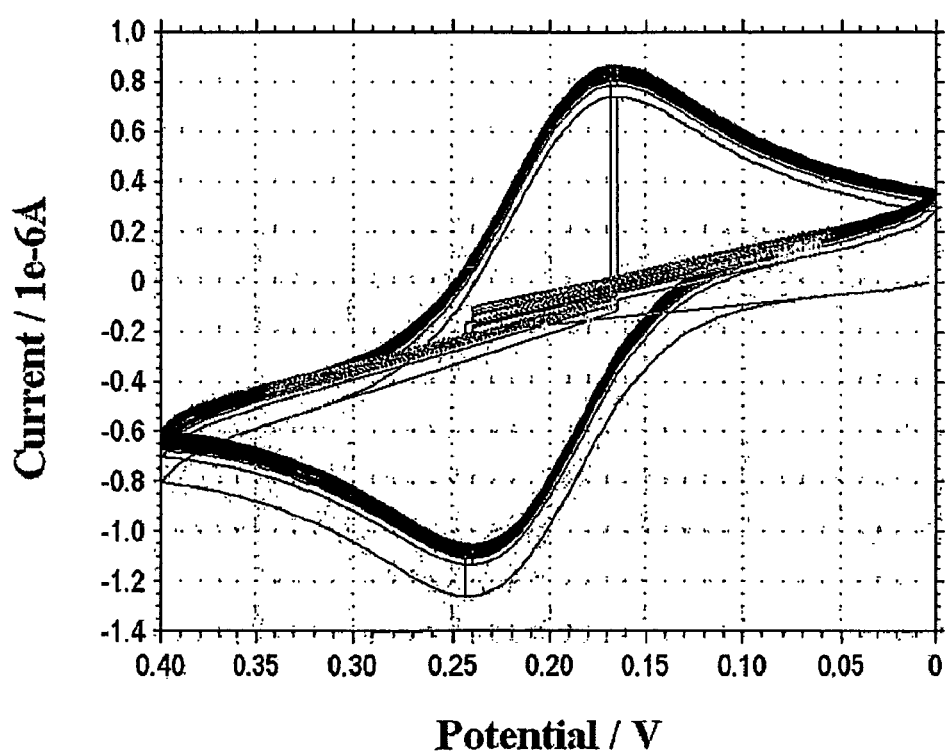
FIG. 15 is a graph showing a measurement result in the case of performing the CV measurement regarding an anthracene derivative.

The result is shown in FIG. 15. Note that the horizontal axis and the vertical axis respectively indicate a potential (v) with respect to the Ag/Ag$^+$ electrode and a current value (A) in FIG. 15. According to FIG. 15, it is apparent that the oxidation potential is 24 V (vs. Ag/Ag$^+$ electrode). In addition, there is scarcely any variation in peak position or peak intensity of the CV curve in FIG. 15 in spite of the repeated 500 cycles of operations. From this result, it was apparent that DPABPA of the present invention is extremely stable with respect to oxidation.

Embodiment 2

Holes are generated in a layer containing DPABPA which is one of the anthracene derivatives represented by the general formula (1) and which is an anthracene derivative synthesized according to Embodiment 1 and molybdenum oxide which is a substance showing electron acceptability to the DPABPA. This was confirmed in the following experiment, which will be explained.

In this embodiment, a sample 1 provided with a layer containing DPABPA and molybdenum oxide over a glass substrate and a sample 2 provided with a layer only containing DPABPA over a glass substrate are prepared.

In the sample 1, the layer containing DPABPA and molybdenum oxide was formed to be 100 nm thick by a co-evaporation method with the use of DPABPA and molybdenum trioxide as a raw material. In addition, the mixture ratio of DPABPA to molybdenum oxide was set to be 4:1 by mass ratio (the ratio of DPABPA to molybdenum oxide was set to be 1:1.8 in terms of molar ratio).

Moreover, in the sample 2, the layer only containing DPABPA was formed to be 70 nm thick by a vacuum vapor deposition method.

Figure 16:
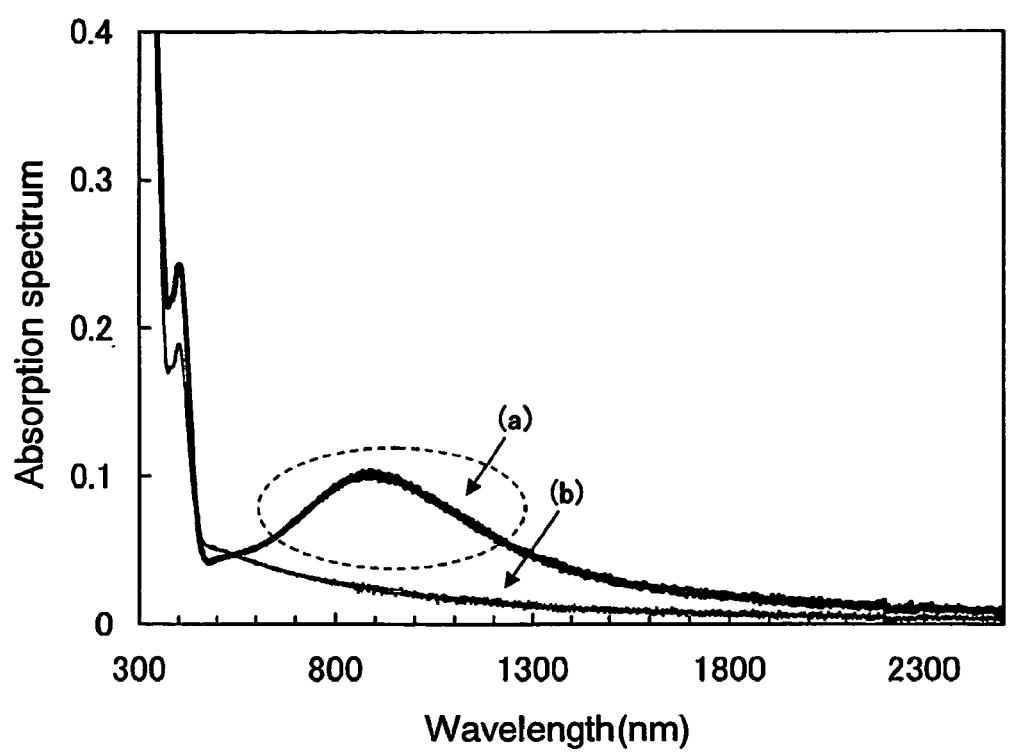
FIG. 16 is an absorption spectrum of samples 1 and 2 used in Embodiment 2.

Each of the samples 1 and 2 is irradiated with light, with the wavelength is changed from 300 nm to 2500 nm, and absorption intensity of light in a layer provided for each sample was examined in each wavelength. The result is shown in FIG. 16. Note that a horizontal axis represents a wavelength (nm) of light with which each sample is irradiated, and a vertical axis represents absorption intensity (no unit) of light in each sample. In addition, the absorption spectrum of the sample 1 is represented by (a), whereas the absorption spectrum of the sample 2 is represented by (b).

FIG. 16 shows absorption accompanied by a maximum value in the vicinity of 900 nm (a portion surrounded by a broken line) in the sample 1 but does not show a peak that shows new absorption in the wavelength range of 450 nm or more in the sample 2. In the absorption of the sample 1 in the portion surrounded by a broken line, a charge-transfer complex is formed, which shows that holes are generated.

Embodiment 3

Figure 17:
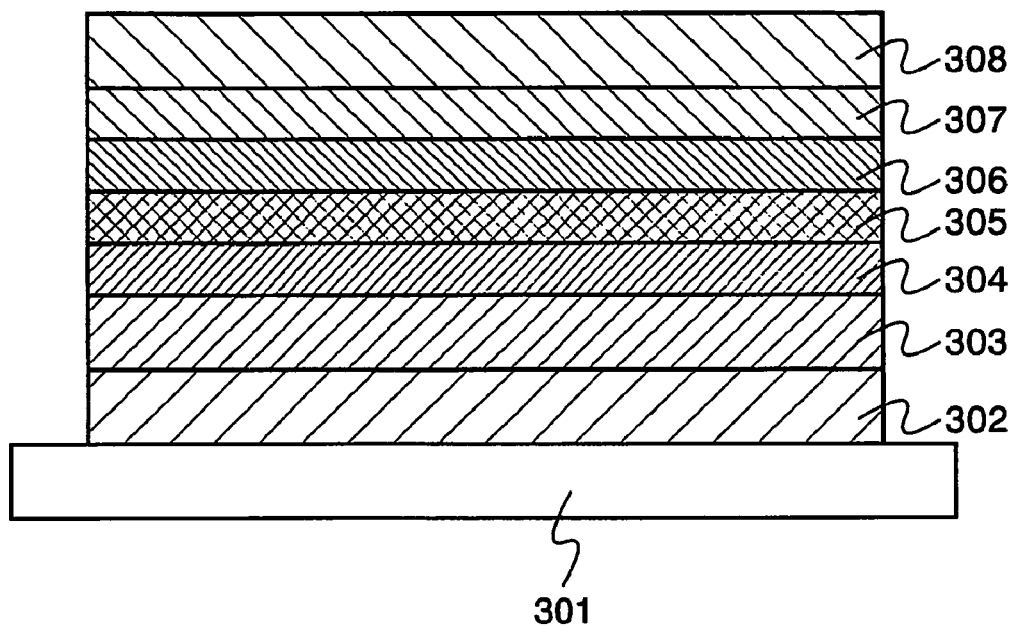
FIG. 17 is a diagram explaining a method for manufacturing a light-emitting element of Embodiment 3.

This embodiment explains a method for manufacturing a light-emitting element having a layer containing DPABPA synthesized according to Synthesis Example 1 and molybdenum oxide, and an operating characteristic of the light-emitting element with reference to FIG. 17.

As shown in FIG. 17, indium tin oxide containing silicon oxide was deposited over a glass substrate 301 by a sputtering method to form a first electrode 302. The film thickness of the first electrode 302 was made to be 110 nm.

Next, the glass substrate 301 where the first electrode 302 is formed was fixed to a holder provided in a vacuum evaporator so that a surface where the first electrode is formed faces downward.

Then, inside of the vacuum evaporator is exhausted and decompressed to be $1 \times 10^{-4}$ Pa. Thereafter, a first layer 303 containing DPABPA and molybdenum oxide was formed over the first electrode 302 by a co-evaporation method with the use of DPABPA and molybdenum trioxide as a raw material. The film thickness of the first layer 303 was made to be 50 nm. In addition, the mass ratio of DPABPA to molybdenum oxide was set to be 4:1 (the ratio of DPABPA to molybdenum oxide was set to be 1:1.8 in terms of molar ratio). This first layer 303 is a layer that functions as a hole-generating layer when a light-emitting element is made to operate.

Thereafter, a second layer 304 was formed over the first layer 303 by a vapor deposition method with the use of NBP. The film thickness of the second layer 304 was made to be 10 nm. This second layer 304 is a layer that functions as a hole-transporting layer when a light-emitting element is made to operate.

Next, a third layer 305 containing $Alq_3$ and coumarin 6 was formed over the second layer 304 by a co-evaporation method. The film thickness of the third layer 305 was made to be 40 nm and the mass ratio of $Alq_3$ to coumarin 6 was set to be 1:0.01. Accordingly, coumarin 6 is contained in a layer where $Alq_3$ is a matrix. This third layer 305 is a layer that functions as a light-emitting layer when a light-emitting element is made to operate. Note that coumarin 6 functions as a light-emitting substance.

Then, a fourth layer 306 was formed over the third layer 305 by a vapor deposition method with the use of $Alq_3$. The film thickness of the fourth layer 306 was made to be 10 nm. This fourth layer 306 is a layer that functions as an electron-transporting layer when a light-emitting element is made to operate.

Thereafter, a fifth layer 307 containing $Alq_3$ and Li was formed over the fourth layer 306 by a co-evaporation method. The film thickness of the fifth layer 307 was made to be 30 nm. In addition, the mass ratio of $Alq_3$ to Li was set to be 1:0.01. This fifth layer 307 is a layer that functions as an electron-injecting layer when a light-emitting element is made to operate.

Next, a second electrode 308 made from aluminum was formed over the fifth layer 307. The film thickness of the second electrode 308 was made to be 200 nm.

In a light-emitting element manufactured according to the above manner, a current flows when a voltage is applied so that the potential of the first electrode 302 gets higher than the potential of the second electrode 308 and light is emitted when excitation energy is generated after recombining electrons and holes in the third layer 305 that functions as a light-emitting layer and the excited coumarin 6 returns to a ground state.

In a glove box under a nitrogen atmosphere, a sealing operation is performed so that this light-emitting element is not exposed to an atmosphere. Thereafter, an operating characteristic of the light-emitting element is measured. Note that measurement was performed at a room temperature (an atmosphere kept at 25° C.).

Figure 18:
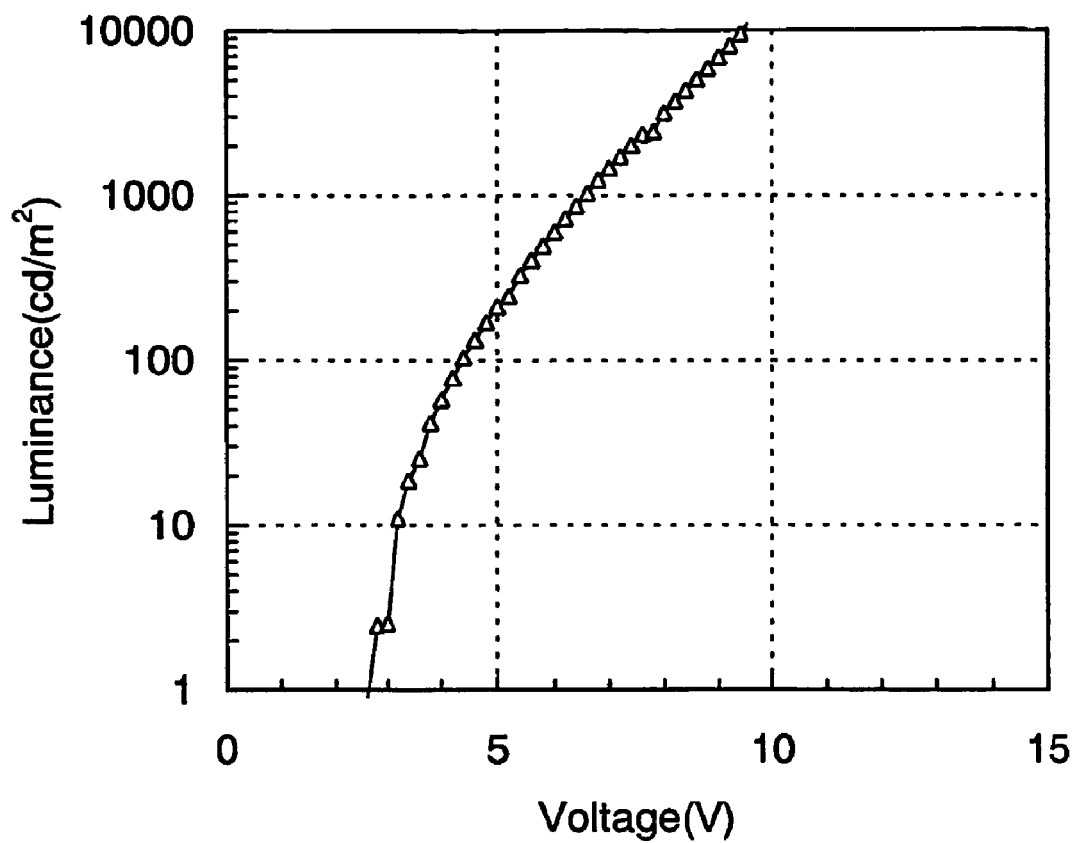
FIG. 18 is a graph showing voltage-luminance characteristics of a light-emitting element of Embodiment 3.
Figure 19:
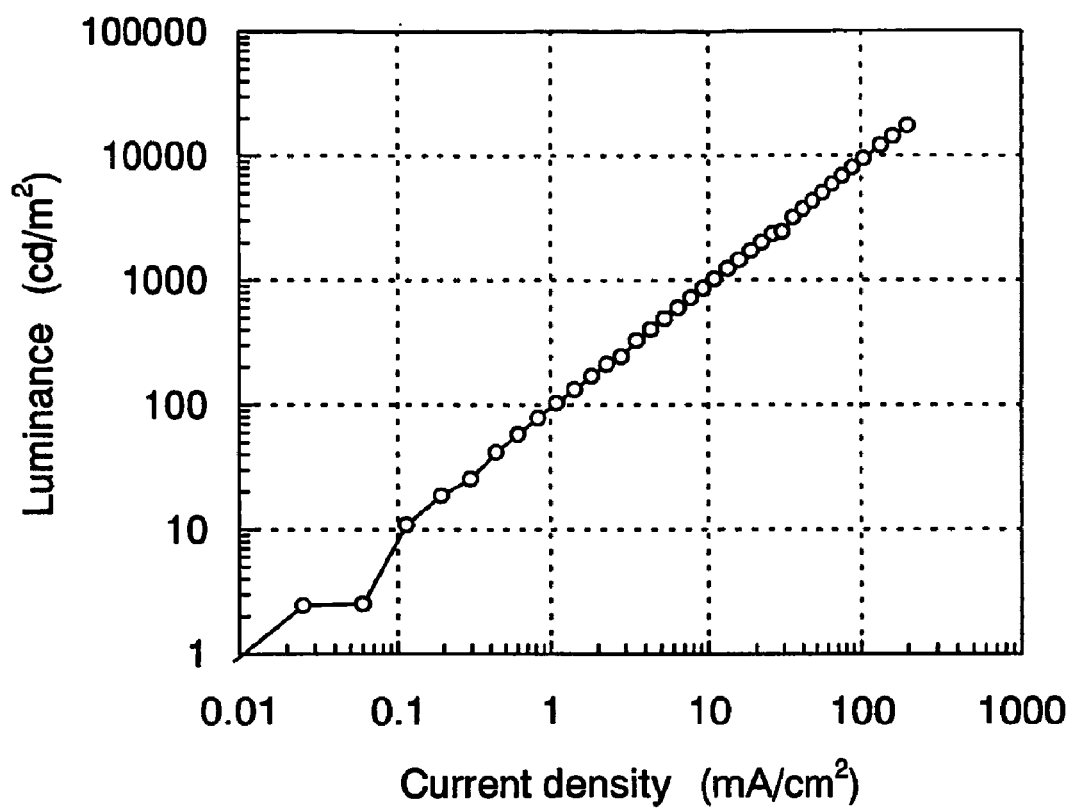
FIG. 19 is current density-luminance characteristics of a light-emitting element of Embodiment 3.

FIGS. 18 and 19 each show measurement result. FIG. 18 shows a result regarding voltage-luminance characteristics, and FIG. 19 shows a result regarding current density-luminance characteristics. In FIG. 18, a horizontal axis represents a voltage (v), whereas a vertical axis represents a luminance ($cd/m^2$). In addition, in FIG. 19, a horizontal axis represents a current density ($mA/cm^2$), whereas a vertical axis represents a luminance ($cd/m^2$).

Figure 20:
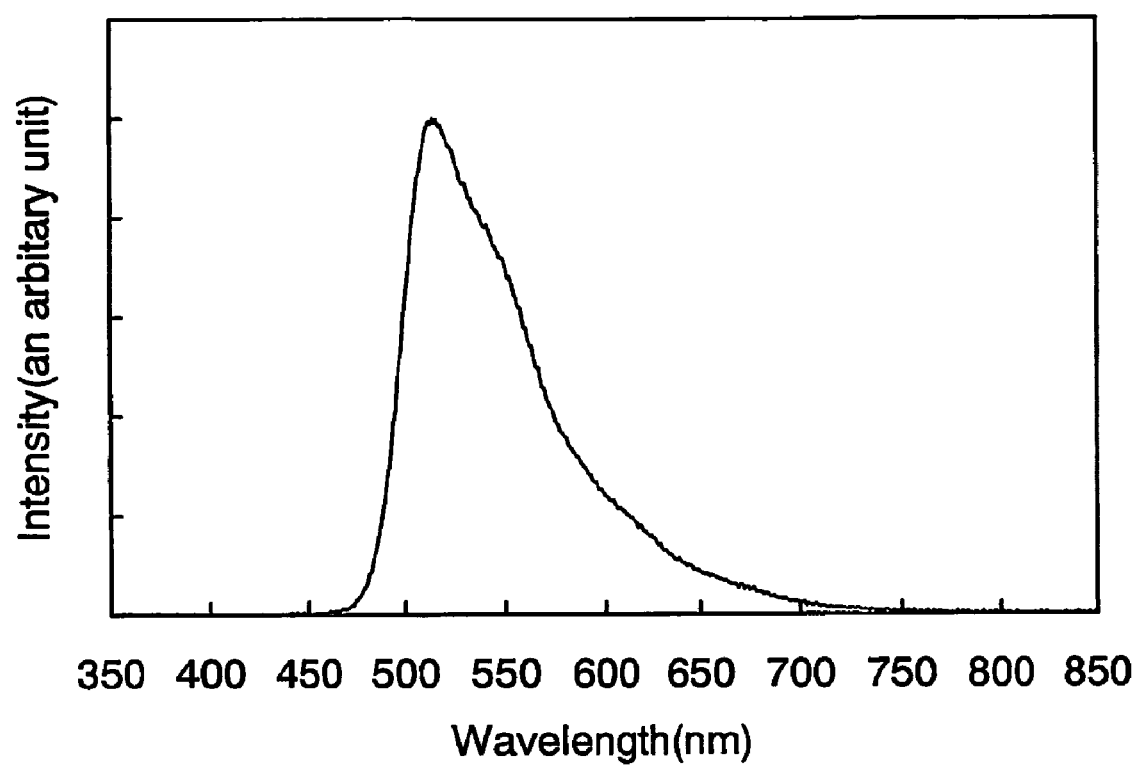
FIG. 20 is an emission spectrum of a light-emitting element of Embodiment 3.

In addition, FIG. 20 shows an emission spectrum of a light-emitting element manufactured according to this embodiment. In FIG. 20, a horizontal axis represents a wavelength (nm), whereas a vertical axis represents intensity (an arbitrary unit). According to FIG. 20, it is apparent that a light-emitting element in this embodiment has an emission spectrum peak at 514 nm and emits light resulted from coumarin 6.

The invention claimed is:

1. A light-emitting element comprising:
   a first electrode and a second electrode, and
   a first layer, a second layer and a third layer formed between the first electrode and the second electrode,
   wherein the first layer contains an anthracene derivative represented by a general formula (1) and a first substance that shows electron acceptability to the anthracene derivative,
   wherein the anthracene derivative represented by the general formula (1) and the first substance are mixed,
   wherein the second layer contains a light-emitting substance, wherein the third layer contains a second substance having electron mobility of $1 \times 10^{-6}$ cm$^2$/Vs or more and a third substance that shows electron-donating property to the second substance,

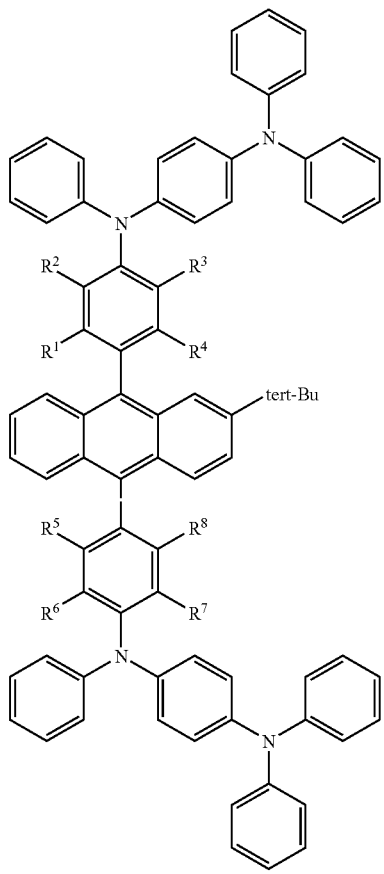

(1)

wherein $R^1$ to $R^8$ are individually any one of hydrogen and an alkyl group having 1 to 4 carbon atoms, or $R^1$ and $R^2$, $R^3$ and $R^4$, $R^5$ and $R^6$, and $R^7$ and $R^8$ are individually bonded to form an aromatic ring, and wherein the bond of $R^1$ and $R^2$, the bond of $R^3$ and $R^4$, the bond of $R^5$ and $R^6$, and the bond of $R^7$ and $R^8$ are independent of one another.

2. The light-emitting element according to claim 1, wherein the first substance is at least one of substances selected from molybdenum oxide; vanadium oxide, ruthenium oxide, and rhenium oxide.

3. The light-emitting element according to claim 1, wherein one of the first electrode and the second electrode includes indium tin oxide or indium tin oxide containing silicon oxide.

4. The light-emitting element according to claim 1, wherein one of the first electrode and the second electrode includes aluminum or magnesium.

5. The light-emitting element according to claim 1, wherein the first substance is metal oxide.

6. The light-emitting element according to claim 1, wherein the third substance is at least one of substances selected from lithium oxide, calcium oxide, natrium oxide, potassium oxide, magnesium oxide, lithium fluoride, cesium fluoride, and calcium fluoride.

7. The light-emitting element according to claim 1, wherein the second layer is provided between the first layer and the third layer.

8. The light-emitting device using a light-emitting element according to claim 1 or 2 as a pixel or a light source.

9. The electronic device using a light-emitting element according to claim 1 to 2 as a display portion.

* * * * *